United States Patent
Zhang et al.

(10) Patent No.: US 9,627,395 B2
(45) Date of Patent: Apr. 18, 2017

(54) ENHANCED CHANNEL MOBILITY THREE-DIMENSIONAL MEMORY STRUCTURE AND METHOD OF MAKING THEREOF

(71) Applicant: SANDISK TECHNOLOGIES INC., Plano, TX (US)

(72) Inventors: Yanli Zhang, San Jose, CA (US); Raghuveer S. Makala, Campbell, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/619,691

(22) Filed: Feb. 11, 2015

(65) Prior Publication Data

US 2016/0233227 A1    Aug. 11, 2016

(51) Int. Cl.

| | | |
|---|---|---|
| *H01L 27/115* | (2006.01) | |
| *H01L 21/324* | (2006.01) | |
| *H01L 21/768* | (2006.01) | |
| *H01L 21/28* | (2006.01) | |
| *H01L 23/522* | (2006.01) | |

(Continued)

(52) U.S. Cl.
CPC .. *H01L 27/11556* (2013.01); *H01L 21/28273* (2013.01); *H01L 21/76802* (2013.01); *H01L 21/76877* (2013.01); *H01L 29/7883* (2013.01)

(58) Field of Classification Search
None
See application file for complete search history.

(56) References Cited

U.S. PATENT DOCUMENTS

| | | |
|---|---|---|
| 3,414,892 A | 12/1968 | McCormack et al. |
| 3,432,827 A | 3/1969 | Samo |
| 3,571,809 A | 3/1971 | Nelson |

(Continued)

OTHER PUBLICATIONS

Endoh, et al., "Novel Ultra High Density Memory with a Stacked-Surrounding Gate Transistor (S-SGT) Structured Cell," IEDM Proc. (2001) 33-36.

(Continued)

*Primary Examiner* — Robert Carpenter
(74) *Attorney, Agent, or Firm* — The Marbury Law Group LLC

(57) ABSTRACT

A stack including an alternating plurality of first material layers and second material layers is provided. A memory opening is formed and at least a contiguous semiconductor material portion including a semiconductor channel is formed therein. The contiguous semiconductor material portion includes an amorphous or polycrystalline semiconductor material. A metallic material portion is provided at a bottom surface of the semiconductor channel, at a top surface of the semiconductor channel, or on portions of an outer sidewall surface of the semiconductor channel. An anneal is performed to induce diffusion of a metal from the metallic material portion through the semiconductor channel, thereby inducing conversion of the amorphous or polycrystalline semiconductor material into a crystalline semiconductor material. The crystalline semiconductor material has a relatively large grain size due to the catalytic crystallization process, and can provide enhanced charge carrier mobility.

29 Claims, 35 Drawing Sheets

(51) Int. Cl.
   *H01L 29/788* (2006.01)
   *H01L 27/11556* (2017.01)

(56) References Cited

U.S. PATENT DOCUMENTS

| | | |
|---|---|---|
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |
| 3,717,852 A | 2/1973 | Abbas et al. |
| 3,728,695 A | 4/1973 | Frohman-Bentchkowsky |
| 3,787,822 A | 1/1974 | Rioult |
| 3,846,767 A | 11/1974 | Cohen |
| 3,863,231 A | 1/1975 | Taylor |
| 3,877,049 A | 4/1975 | Buckley |
| 3,886,577 A | 5/1975 | Buckley |
| 3,922,648 A | 11/1975 | Buckley |
| 3,980,505 A | 9/1976 | Buckley |
| 3,990,098 A | 11/1976 | Mastrangelo |
| 4,037,243 A | 7/1977 | Hoffman et al. |
| 4,146,902 A | 3/1979 | Tanimoto et al. |
| 4,177,475 A | 12/1979 | Holmberg |
| 4,203,123 A | 5/1980 | Shanks |
| 4,203,158 A | 5/1980 | Frohman-Bentchkowsky et al. |
| 4,272,880 A | 6/1981 | Pashley |
| 4,281,397 A | 7/1981 | Neal et al. |
| 4,355,375 A | 10/1982 | Arakawa |
| 4,419,741 A | 12/1983 | Stewart et al. |
| 4,420,766 A | 12/1983 | Kasten |
| 4,442,507 A | 4/1984 | Roesner |
| 4,489,478 A | 12/1984 | Sakurai |
| 4,494,135 A | 1/1985 | Moussie |
| 4,498,226 A | 2/1985 | Inoue et al. |
| 4,499,557 A | 2/1985 | Holmberg et al. |
| 4,500,905 A | 2/1985 | Shibata |
| 4,507,757 A | 3/1985 | McElroy |
| 4,535,424 A | 8/1985 | Reid |
| 4,543,594 A | 9/1985 | Mohsen et al. |
| 4,569,121 A | 2/1986 | Lim et al. |
| 4,630,096 A | 12/1986 | Drye et al. |
| 4,639,893 A | 1/1987 | Eitan |
| 4,646,266 A | 2/1987 | Ovshinsky et al. |
| 4,672,577 A | 6/1987 | Hirose |
| 4,677,742 A | 7/1987 | Johnson |
| 4,692,994 A | 9/1987 | Moniwa et al. |
| 4,710,798 A | 12/1987 | Marcantonio |
| 4,728,626 A | 3/1988 | Tu |
| 4,729,005 A | 3/1988 | Wei et al. |
| 4,774,556 A | 9/1988 | Fujii et al. |
| 4,811,082 A | 3/1989 | Jacobs |
| 4,811,114 A | 3/1989 | Yamamoto et al. |
| 4,820,657 A | 4/1989 | Hughes et al. |
| 4,823,181 A | 4/1989 | Mohsen et al. |
| 4,876,220 A | 10/1989 | Mohsen et al. |
| 4,881,114 A | 11/1989 | Mohsen et al. |
| 4,899,205 A | 2/1990 | Hamdy et al. |
| 4,922,319 A | 5/1990 | Fukushima |
| 4,943,538 A | 7/1990 | Mohsen et al. |
| 4,967,247 A | 10/1990 | Kaga et al. |
| 5,001,539 A | 3/1991 | Inoue et al. |
| 5,006,909 A | 4/1991 | Kosa |
| 5,070,383 A | 12/1991 | Sinar et al. |
| 5,070,384 A | 12/1991 | McCollum et al. |
| 5,089,862 A | 2/1992 | Warner, Jr. et al. |
| 5,091,762 A | 2/1992 | Watanabe |
| 5,160,987 A | 11/1992 | Pricer et al. |
| 5,191,405 A | 3/1993 | Tomita et al. |
| 5,191,551 A | 3/1993 | Inoue |
| 5,202,754 A | 4/1993 | Bertin et al. |
| 5,266,912 A | 11/1993 | Kledzik |
| 5,268,319 A | 12/1993 | Harari |
| 5,270,562 A | 12/1993 | Wuidart |
| 5,283,458 A | 2/1994 | Stokes et al. |
| 5,283,468 A | 2/1994 | Kondo et al. |
| 5,306,935 A | 4/1994 | Esquivel et al. |
| 5,311,039 A | 5/1994 | Kimura et al. |
| 5,321,286 A | 6/1994 | Koyama et al. |
| 5,334,880 A | 8/1994 | Abadeer et al. |
| 5,379,255 A | 1/1995 | Shah |
| 5,391,518 A | 2/1995 | Bhushan |
| 5,391,907 A | 2/1995 | Jang |
| 5,397,908 A | 3/1995 | Dennison et al. |
| 5,398,200 A | 3/1995 | Mazure et al. |
| 5,422,435 A | 6/1995 | Takiar et al. |
| 5,426,566 A | 6/1995 | Beilstein, Jr. |
| 5,427,979 A | 6/1995 | Chang |
| 5,434,745 A | 7/1995 | Shokrgozar et al. |
| 5,441,907 A | 8/1995 | Sung et al. |
| 5,453,952 A | 9/1995 | Okudaira |
| 5,455,445 A | 10/1995 | Kurtz et al. |
| 5,463,244 A | 10/1995 | De Araujo et al. |
| 5,468,663 A | 11/1995 | Bertin et al. |
| 5,468,997 A | 11/1995 | Imai et al. |
| 5,471,090 A | 11/1995 | Deutsch |
| 5,481,133 A | 1/1996 | Hsu |
| 5,483,094 A | 1/1996 | Sharma et al. |
| 5,495,398 A | 2/1996 | Takiar et al. |
| 5,502,289 A | 3/1996 | Takiar et al. |
| 5,517,044 A | 5/1996 | Koyama |
| 5,523,622 A | 6/1996 | Harada et al. |
| 5,535,156 A | 7/1996 | Levy et al. |
| 5,536,968 A | 7/1996 | Crafts et al. |
| 5,552,963 A | 9/1996 | Burns |
| 5,557,122 A | 9/1996 | Shrivastava et al. |
| 5,559,048 A | 9/1996 | Inoue |
| 5,561,622 A | 10/1996 | Bertin et al. |
| 5,581,498 A | 12/1996 | Ludwig et al. |
| 5,585,675 A | 12/1996 | Knopf |
| 5,612,570 A | 3/1997 | Eide et al. |
| 5,654,220 A | 8/1997 | Leedy |
| 5,675,547 A | 10/1997 | Koga |
| 5,693,552 A | 12/1997 | Hsu |
| 5,696,031 A | 12/1997 | Wark |
| 5,703,747 A | 12/1997 | Voldman et al. |
| 5,737,259 A | 4/1998 | Chang |
| 5,739,567 A | 4/1998 | Wong |
| 5,745,407 A | 4/1998 | Levy et al. |
| 5,751,012 A | 5/1998 | Wolstenholme et al. |
| 5,751,037 A | 5/1998 | Aozasa et al. |
| 5,768,192 A | 6/1998 | Eitan |
| 5,776,810 A | 7/1998 | Guterman et al. |
| 5,780,925 A | 7/1998 | Cipolla et al. |
| 5,781,031 A | 7/1998 | Bertin et al. |
| 5,801,437 A | 9/1998 | Burns |
| 5,825,046 A | 10/1998 | Czubatyj et al. |
| 5,835,396 A | 11/1998 | Zhang |
| 5,840,589 A | 11/1998 | Warner et al. |
| 5,852,317 A | 12/1998 | Berman |
| 5,883,409 A | 3/1999 | Guterman et al. |
| 5,889,302 A | 3/1999 | Liu |
| 5,903,492 A | 5/1999 | Takashima |
| 5,915,167 A | 6/1999 | Leedy |
| 5,930,608 A | 7/1999 | Yamazaki et al. |
| 5,936,280 A | 8/1999 | Liu |
| 5,939,749 A | 8/1999 | Taketa et al. |
| 5,966,603 A | 10/1999 | Eitan |
| 5,969,380 A | 10/1999 | Seyyedy |
| 5,973,356 A | 10/1999 | Noble et al. |
| 5,976,953 A | 11/1999 | Zavracky et al. |
| 5,978,258 A | 11/1999 | Manning |
| 5,981,974 A | 11/1999 | Makita |
| 5,982,003 A | 11/1999 | Hu et al. |
| 5,985,693 A | 11/1999 | Leedy |
| 5,998,808 A | 12/1999 | Matsushita |
| 5,999,453 A | 12/1999 | Kawata |
| 6,005,270 A | 12/1999 | Noguchi |
| 6,011,725 A | 1/2000 | Eitan |
| 6,028,326 A | 2/2000 | Uochi et al. |
| 6,034,882 A | 3/2000 | Johnson et al. |
| 6,057,598 A | 5/2000 | Payne et al. |
| 6,066,547 A | 5/2000 | Maekawa |

(56) References Cited

U.S. PATENT DOCUMENTS

| | | |
|---|---|---|
| 6,072,193 A | 6/2000 | Ohnuma et al. |
| 6,072,234 A | 6/2000 | Camien et al. |
| 6,075,719 A | 6/2000 | Lowrey et al. |
| 6,087,674 A | 7/2000 | Ovshinsky et al. |
| 6,087,722 A | 7/2000 | Lee et al. |
| 6,107,666 A | 8/2000 | Chang |
| 6,110,278 A | 8/2000 | Saxena |
| 6,114,767 A | 9/2000 | Nagai et al. |
| 6,133,640 A | 10/2000 | Leedy |
| 6,137,718 A | 10/2000 | Reisinger |
| 6,141,241 A | 10/2000 | Ovshinsky et al. |
| 6,153,495 A | 11/2000 | Kub et al. |
| 6,157,061 A | 12/2000 | Kawata |
| 6,184,088 B1 | 2/2001 | Kurooka et al. |
| 6,185,122 B1 | 2/2001 | Johnson et al. |
| 6,188,605 B1 | 2/2001 | Nomura et al. |
| 6,191,459 B1 | 2/2001 | Hofmann et al. |
| 6,197,641 B1 | 3/2001 | Hergenrother et al. |
| 6,208,545 B1 | 3/2001 | Leedy |
| 6,211,015 B1 | 4/2001 | Noble |
| 6,255,705 B1 | 7/2001 | Zhang et al. |
| 6,281,042 B1 | 8/2001 | Ahn et al. |
| 6,285,055 B1 | 9/2001 | Gosain et al. |
| 6,291,858 B1 | 9/2001 | Ma et al. |
| 6,299,338 B1 | 10/2001 | Levinson et al. |
| 6,307,257 B1 | 10/2001 | Huang et al. |
| 6,314,013 B1 | 11/2001 | Ahn et al. |
| 6,322,903 B1 | 11/2001 | Siniaguine et al. |
| 6,323,515 B1 | 11/2001 | Yamazaki et al. |
| 6,335,554 B1 | 1/2002 | Yoshikawa |
| 6,337,521 B1 | 1/2002 | Masuda |
| 6,351,028 B1 | 2/2002 | Akram |
| 6,353,265 B1 | 3/2002 | Michii |
| 6,355,501 B1 | 3/2002 | Fung et al. |
| 6,433,382 B1 | 8/2002 | Orlowski et al. |
| 6,472,684 B1 | 10/2002 | Yamazaki et al. |
| 6,486,027 B1 | 11/2002 | Noble et al. |
| 6,498,369 B1 | 12/2002 | Yamazaki et al. |
| 6,509,602 B2 | 1/2003 | Yamazaki et al. |
| 6,509,638 B2 | 1/2003 | Fujimoto |
| 6,525,962 B1 | 2/2003 | Pai et al. |
| 6,551,857 B2 | 4/2003 | Leedy |
| 6,577,531 B2 | 6/2003 | Kato |
| 6,587,365 B1 | 7/2003 | Salling |
| 6,593,624 B2 | 7/2003 | Walker |
| 6,627,518 B1 | 9/2003 | Inoue et al. |
| 6,653,733 B1 | 11/2003 | Gonzalez et al. |
| 6,713,810 B1 | 3/2004 | Bhattacharyya |
| 6,730,543 B2 | 5/2004 | Akram |
| 6,812,575 B2 | 11/2004 | Furusawa |
| 6,841,813 B2 | 1/2005 | Walker et al. |
| 6,853,049 B2 | 2/2005 | Herner |
| 6,888,750 B2 | 5/2005 | Walker et al. |
| 7,125,763 B1 | 10/2006 | Sobek et al. |
| 7,486,537 B2 | 2/2009 | Scheuerlein et al. |
| 8,349,681 B2 * | 1/2013 | Alsmeier ............ H01L 27/11551 257/E21.309 |
| 9,318,329 B2 * | 4/2016 | Kohji ................ H01L 21/28282 |

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.

* cited by examiner

ENHANCED CHANNEL MOBILITY THREE-DIMENSIONAL MEMORY STRUCTURE AND METHOD OF MAKING THEREOF

FIELD

The present disclosure relates generally to the field of semiconductor devices and specifically to three-dimensional memory structures, such as vertical NAND strings and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a monolithic three-dimensional memory device is provided. A stack is formed over a substrate. The stack includes an alternating plurality of first material layers and second material layers. An opening that vertically extends through the stack is formed. A semiconductor channel comprising an amorphous or polycrystalline semiconductor material is formed over a sidewall of the opening. The semiconductor channel extends through the stack. A metallic material is diffused through at least a portion of the semiconductor channel. The metallic material induces crystallization of the amorphous or polycrystalline semiconductor material in the semiconductor channel into a crystalline semiconductor material portion.

According to another aspect of the present disclosure, a three-dimensional memory device is provided, which comprises a stack including an alternating plurality of insulator layers and electrically conductive layers and located over a top surface of a substrate; an opening extending through the stack; a memory film located in the opening; a contiguous semiconductor material portion located over the memory film in the opening and comprising a semiconductor channel that includes a portion that extends substantially perpendicular to the top surface of the substrate; and a metal semiconductor alloy region in contact with a bottom surface of the contiguous semiconductor material portion.

DETAILED DESCRIPTION

As discussed above, the present disclosure is directed to three-dimensional memory structures, such as vertical NAND strings, that include a back gate electrode, and methods of making thereof, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
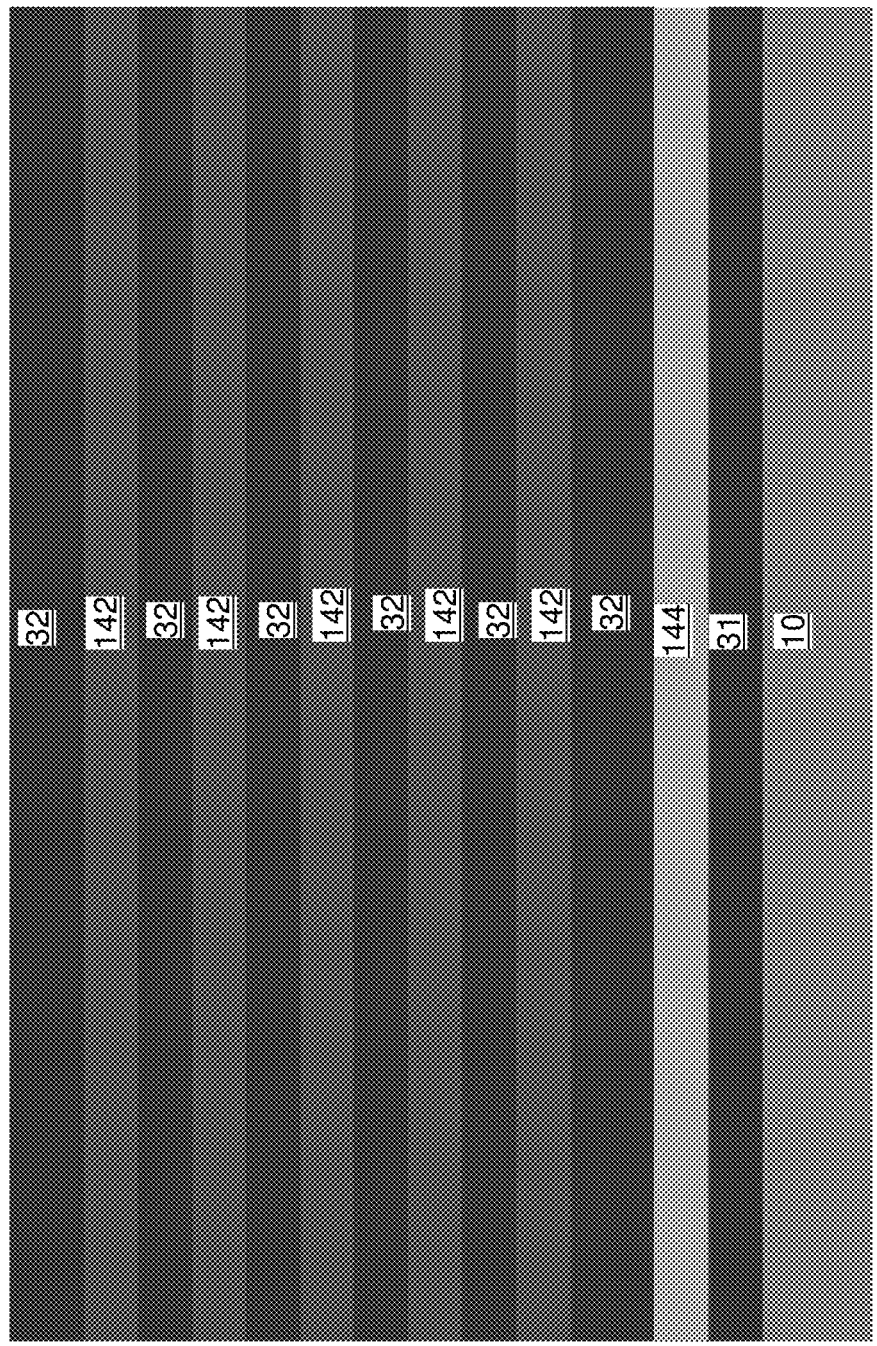
FIG. 1 is a vertical cross-sectional view of a first exemplary structure after formation of a stack of alternating plurality of first material layers and second material layers according to a first embodiment of the present disclosure.

Referring to FIG. 1, a first exemplary structure according to an embodiment of the present disclosure is illustrated, which can be employed, for example, to fabricate a device structure containing vertical NAND memory devices. The exemplary structure includes a substrate 10, which can be a semiconductor substrate. The substrate 10 can include a substrate semiconductor layer, and can include at least one elemental semiconductor material, at least one III-V compound semiconductor material, at least one II-VI compound semiconductor material, at least one organic semiconductor material, or other semiconductor materials known in the art. The substrate can have a major surface, which can be, for example, a topmost surface of the semiconductor material layer. The major surface can be a semiconductor surface. In one embodiment, the major surface can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate 10.

At least one semiconductor device (not shown) for a peripheral circuitry can be formed on a portion of the substrate 10. The at least one semiconductor device can include, for example, field effect transistors. For example, at least one dielectric material portion can be formed by etching portions of the semiconductor material layer and depositing a dielectric material therein. Optionally, a dielectric pad layer (not shown) can be formed above the semiconductor material layer. Optionally, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

Optionally, a bottom insulator layer 31 and a temporary material layer 144 can be formed over the substrate 10. The bottom insulator layer 31 comprises a dielectric material such as silicon oxide, and can have a thickness in a range from 3 nm to 30 nm, although lesser and greater thicknesses can also be employed. The temporary material layer 144 includes a temporary material. As used herein, a "temporary material" refers to a material this is removed in a subsequent processing step. The temporary material can be, for example, a semiconductor material such as polycrystalline or amorphous silicon or a silicon-germanium alloy, or a dielectric material such as silicon nitride. The temporary material is different from the materials of first material layers and second material layers within an alternating stack to be subsequently formed.

A stack of an alternating plurality of first material layers 32 and second material layers 142 is formed over the top surface of the substrate 10, which can be, for example, over the temporary material layer 144. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers. In one embodiment, the alternating plurality of first material layers and second material layers may end with an instance of the first material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer 32 can be an insulator layer, and each second material layer 142 can be a sacrificial material layer. In this case, the stack can include an alternating plurality of first material layers 32 and second material layers 142.

The stack of the alternating plurality is herein referred to as an alternating stack (32, 142). Each first material layer 32 can be composed of the first material, and each second material layer 142 can be composed a second material different from the first material. The first material of the first material layers 32 can be at least one electrically insulating material. In other words, the first material can be an insulator material, and each first material layer 32 can be an insulator layer. As such, each first material layer 32 can be an electrically insulating material layer. Electrically insulating materials that can be employed for the first material layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first material layers 32 can be silicon oxide.

In one embodiment, the second material of the second material layers 142 is a sacrificial material that can be removed selective to the first material of the first material layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

In this case, the second material layers 142 may comprise an electrically insulating material, a semiconductor material, or a conductive material. The second material of the second material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the second material layers 142 can be material layers that comprise silicon nitride or a semiconductor material including at least one of silicon and germanium.

In one embodiment, the first material layers 32 can include silicon oxide, and the sacrificial material layers can include silicon nitride sacrificial material layers. The first material of the first material layers 32 can be deposited, for example, by chemical vapor deposition (CVD). For example, if silicon oxide is employed for the first material layers 32, tetraethyl orthosilicate (TEOS) can be employed as the precursor material for the CVD process. The second material of the second material layers 142 can be formed, for example, CVD or atomic layer deposition (ALD).

Alternatively, the second material of the second material layers 142 is a permanent conductive material, i.e., a conductive material that is not subsequently replaced with any other material. In this case, the second material layers 142 can be conductive material layers. Exemplary conductive materials that can be employed as the second material include, but are not limited to, a conductive metallic nitride material (such as TiN, TaN, and WN), an elemental metal or an alloy thereof (such as W, Cu, Al, and alloys thereof), a doped semiconductor material, or a combination thereof.

The second material layers 142 can be suitably patterned so that conductive material portions that are immediately formed (in case the second material layers 142 are conductive material layers), or to be subsequently formed (by replacement of the sacrificial material of the second material layers 142 with a conductive material) can function as electrically conductive electrodes, such as the control gate electrodes of the monolithic three-dimensional NAND string memory devices to be subsequently formed. The second material layers 142 may comprise a portion having a strip shape extending substantially parallel to the major surface of the substrate.

The thicknesses of the first material layers 32 and the second material layers 142 can be in a range from 20 nm to 50 nm, although lesser and greater thicknesses can be employed for each first material layer 32 and for each second material layer 142. The number of repetitions of the pairs of a first material layer 32 and a sacrificial material layer (e.g., a control gate electrode or a sacrificial material layer) 142 can be in a range from 2 to 1,024, and typically from 8 to 256, although a greater number of repetitions can also be employed. The top and bottom gate electrodes in the stack may function as the select gate electrodes. In one embodiment, each second material layer 142 in the alternating stack (32, 142) can have a uniform thickness that is substantially invariant within each respective second material layer 142.

Figure 2:
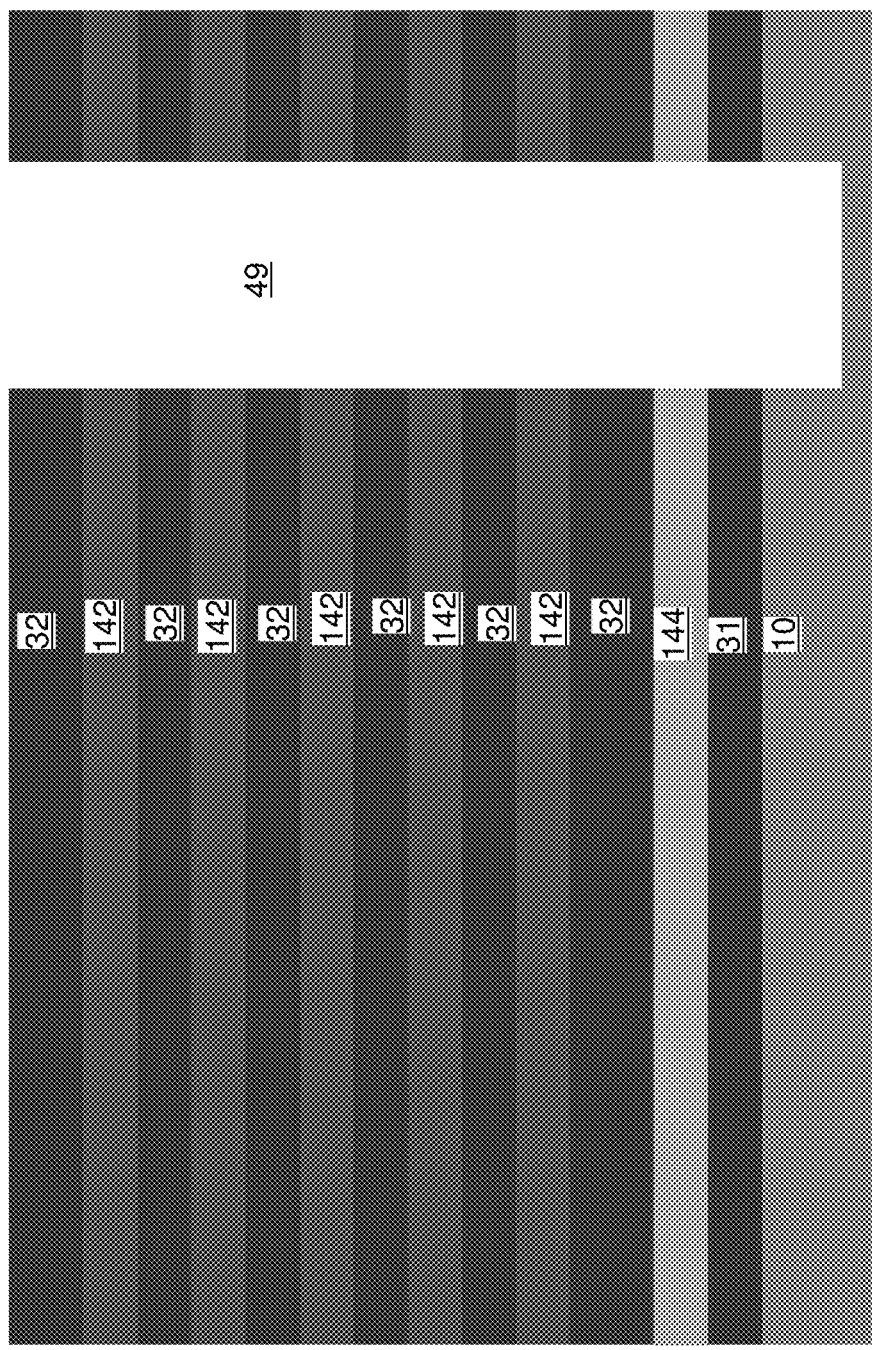
FIG. 2 is a vertical cross-sectional view of the first exemplary structure after formation of a memory opening that vertically extends through the stack according to the first embodiment of the present disclosure.

Referring to FIG. 2, a lithographic material stack (not shown) including at least a photoresist layer can be formed over the alternating stack (32, 142), and can be lithographically patterned to form openings therein. In one embodiment, the pattern of openings can be a periodic pattern that is repeated along at least one horizontal direction. In one embodiment, the pattern of the opening in the photoresist layer can include circular shapes, elliptical shapes, other polygonal shapes, and/or other closed shapes having a curvilinear periphery.

The pattern in the lithographic material stack can be transferred through the entirety of the alternating stack (32, 142), the temporary material layer, and the bottom insulator layer 31, and into an upper portion of the substrate 10 by at least one anisotropic etch that employs the patterned lithographic material stack as an etch mask. Portions of the alternating stack (32, 142), the temporary material layer 144, the bottom insulator layer 31, and the substrate 10 that underlie openings in the patterned lithographic material stack are etched to form openings, which are herein referred to as memory openings 49. While only one memory opening 49 is illustrated in the drawings, it is understood that a plurality of memory openings 49 can be formed through the alternating stack (32, 142), the temporary material layer 142, and the bottom insulator layer 31.

Figure 3:
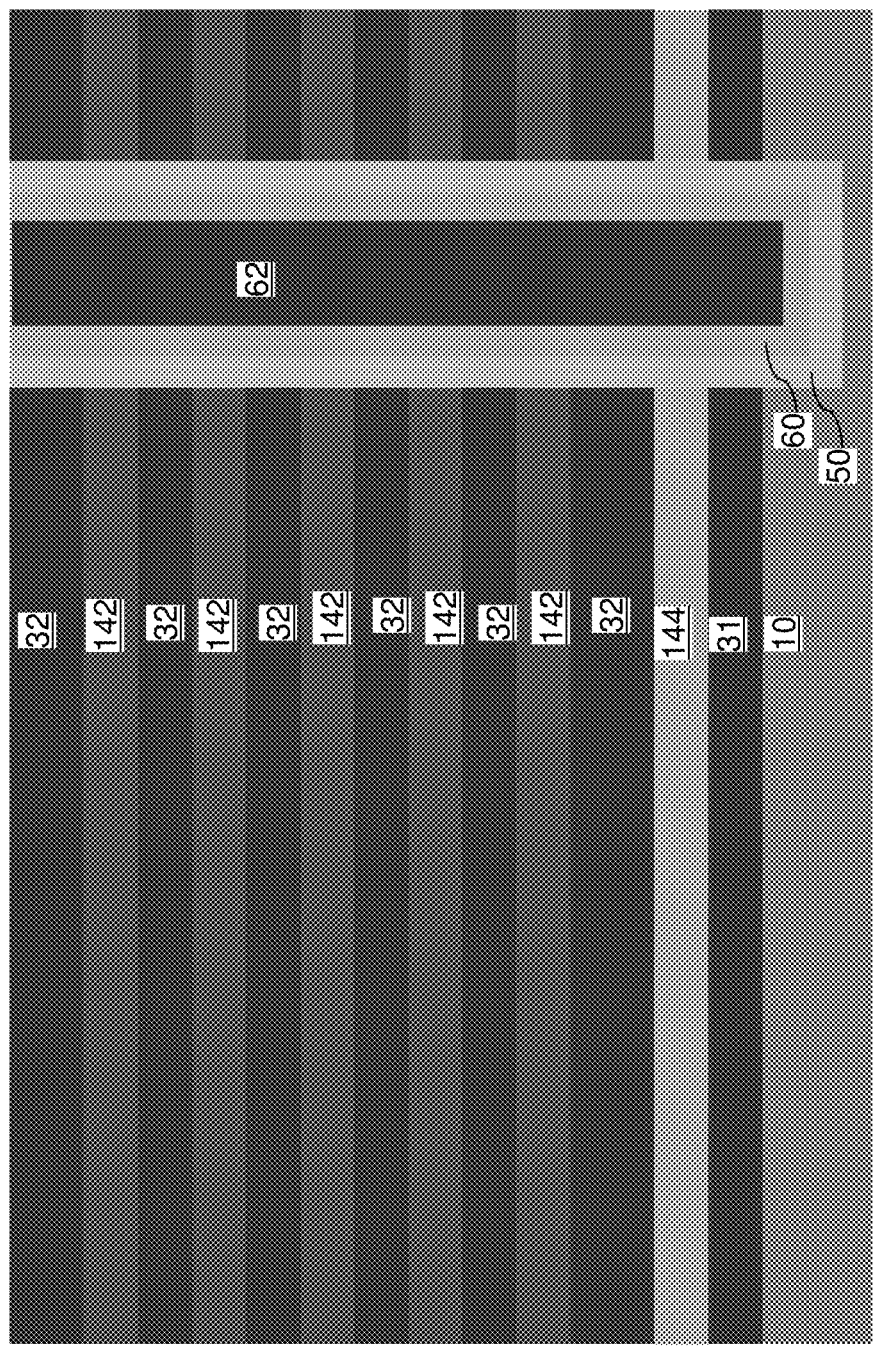
FIG. 3 is a vertical cross-sectional view of the first exemplary structure after formation of a memory film, a semiconductor channel, and a dielectric core according to the first embodiment of the present disclosure.

Referring to FIG. 3, a memory film 50, a semiconductor channel 60, and a dielectric core 62 are formed within each memory opening 49. The memory film 50 can be formed, for example, by sequentially depositing at least one optional blocking dielectric layer, a memory material layer, and a tunneling dielectric layer.

The at least one blocking dielectric layer, if present, can be deposited on the sidewalls of each memory opening 49 by a conformal deposition method. Each of the at least one blocking dielectric layer includes a dielectric material such as a dielectric metal oxide or a dielectric oxide containing at least one semiconductor element (such as silicon oxide). The thickness of the at least one blocking dielectric layer can be in a range from 1 nm to 10 nm, although lesser and greater thicknesses can also be employed.

The memory material layer can be a charge trapping material layer including a dielectric charge trapping material, which can be, for example, silicon nitride. Alternatively, the memory material layer can include a conductive material such as doped polysilicon or a metallic material that is patterned into multiple electrically isolated portions. In this case, the second material layers 142 can be laterally recessed selective to the first material layers 32 prior to formation of the at least one blocking dielectric layer, and the memory material layer can be formed as a plurality of disjoined vertically spaced conductive material portions within the lateral recesses into second material layers 142. In one embodiment, the memory material layer includes a silicon nitride layer.

The memory material layer can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer may comprise an insulating charge trapping material, such as one or more silicon nitride segments. Alternatively, the memory material layer may comprise conductive nanoparticles such as metal nanoparticles, which can be, for example, ruthenium nanoparticles. The memory material layer can be formed, for example, by chemical vapor deposition (CVD), atomic layer deposition (ALD), or any suitable deposition technique for storing electrical charges therein. The thickness of the memory material layer can be in a range from 2 nm to 20 nm, although lesser and greater thicknesses can also be employed.

The tunneling dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can be a stack including, from outside to inside, an outer silicon oxide layer, a silicon nitride layer, and an inner silicon oxide layer. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed.

The semiconductor channel 60 extends through the alternating stack (32, 142), and comprises an amorphous or polycrystalline semiconductor material deposited over the sidewall of each memory opening 49. The semiconductor channel 60 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel 60 includes amorphous silicon or polysilicon. The semiconductor channel 60 can be formed by a conformal deposition method such as low pressure chemical vapor deposition (LPCVD). The thickness of the semiconductor channel 60 can be in a range from 2 nm to 20 nm, although lesser and greater thicknesses can also be employed.

The dielectric core 62, if present, comprises a dielectric material such as silicon oxide. The dielectric core 62 can be formed by deposition of the dielectric material into a remaining cavity within each memory opening, for example, by a conformal deposition method.

Excess portions of the memory film 50, the semiconductor channel 60, and the dielectric material of the dielectric core 62 can be removed from above the top surface of the alternating stack (32, 142), for example, by chemical mechanical planarization (CMP). The memory film 50, the semiconductor channel 60, and the dielectric core 62 within each memory opening collectively constitute a memory stack structure (50, 60, 62).

Figure 4:
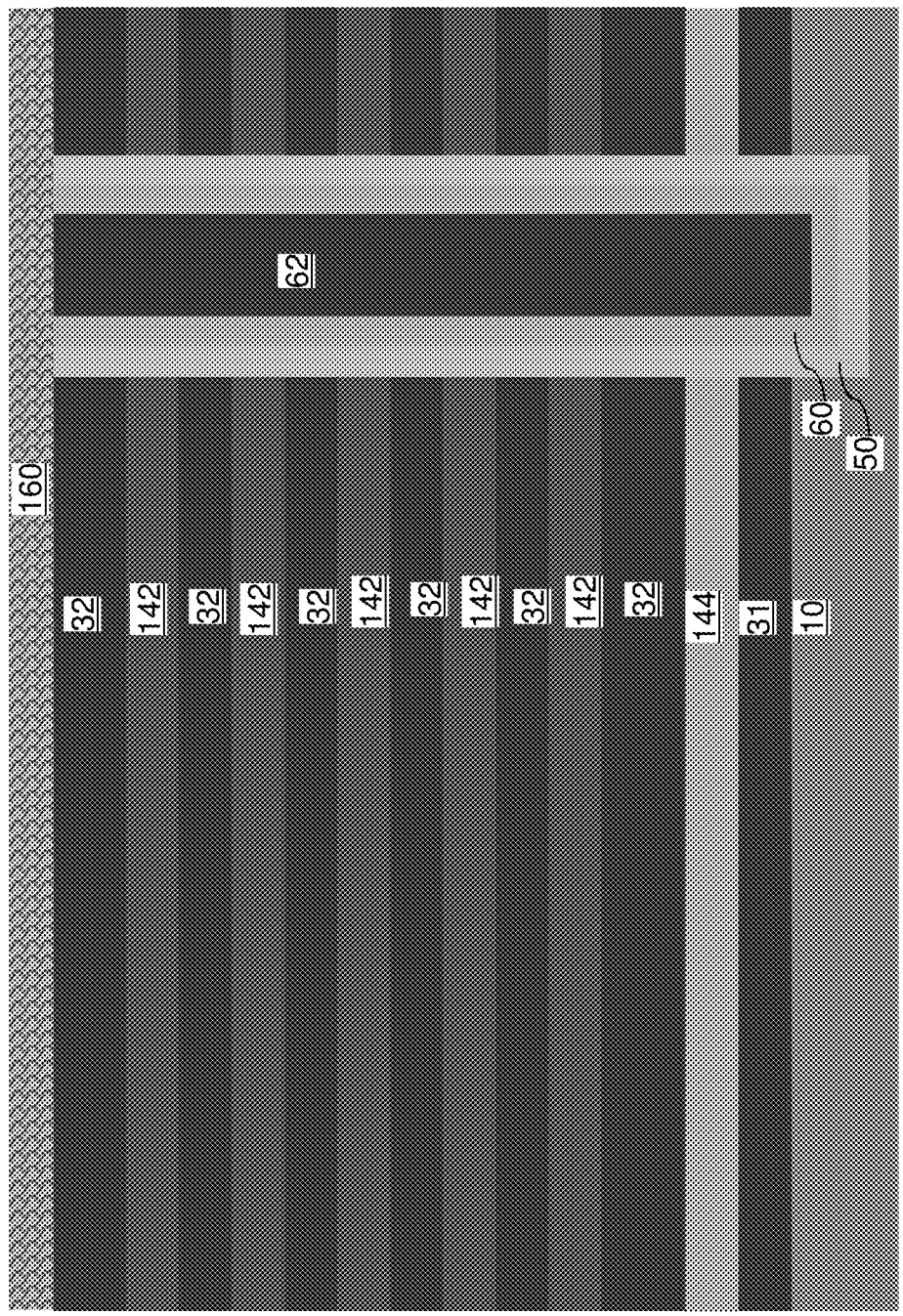
FIG. 4 is a vertical cross-sectional view of the first exemplary structure after formation of a metallic material layer over the stack and the memory opening according to the first embodiment of the present disclosure.

Referring to FIG. 4, a metallic material layer 160 is deposited over the top surface of the alternating stack (32, 142) and the memory stack structure (50, 60, 62). The metallic material layer 160 comprises a transition metal element, a combination of two or more transition metal elements, an oxide thereof, and/or a nitride thereof. The metallic material layer 160 includes a transition metal element that can induce crystallization of the semiconductor material within the semiconductor channel 60 in a subsequent anneal process. For example, in case the semiconductor material of the semiconductor channel 60 comprises polysilicon, amorphous silicon, a polycrystalline silicon-germanium alloy, or an amorphous silicon-germanium alloy, the metallic material layer 160 can comprise a material such as nickel, cobalt, other suitable metals and alloys thereof, such as nickel oxide, nickel silicide and/or cobalt silicide. The metallic material layer 160 can be formed, for example, by physical vapor deposition (PVD) or by chemical vapor deposition (CVD). The thickness of the metallic material layer 160 can be in a range from 1 nm to 30 nm, although lesser and greater thicknesses can also be employed. The metallic material layer 160 is formed directly on a surface of the semiconductor channel 60, e.g., on a top surface of the semiconductor channel 60.

Figure 5:
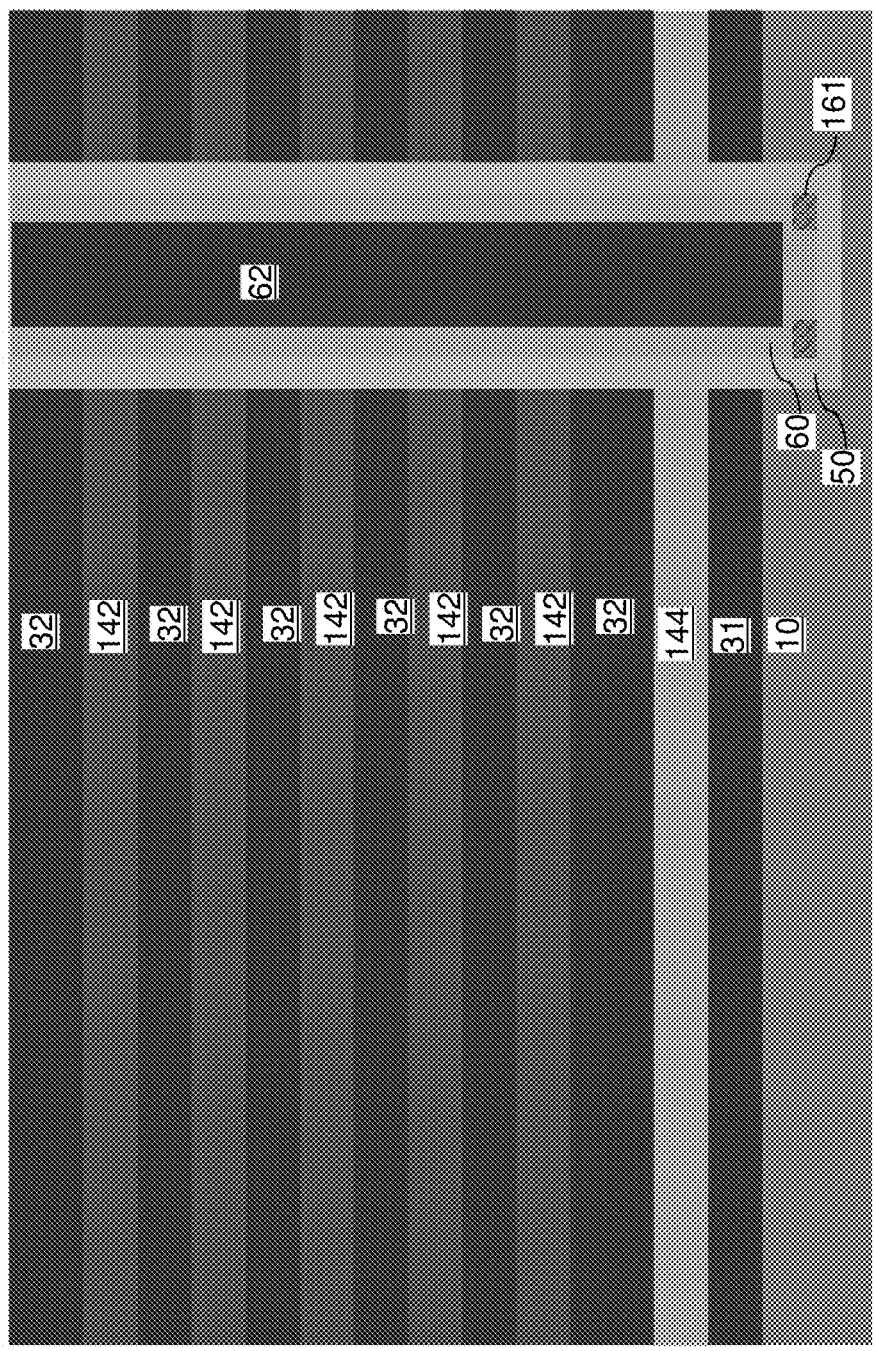
FIG. 5 is a vertical cross-sectional view of the first exemplary structure after diffusing the metallic material of the metallic material layer through the semiconductor channel according to the first embodiment of the present disclosure.

Referring to FIG. 5, an anneal at an elevated temperature is performed to diffuse the metallic material of the metallic material layer 160 downward. The elevated temperature of the anneal process can be in a range from 400 degrees Celsius to 1,000 degrees Celsius, although lesser and greater temperatures can also be employed. The duration of the anneal can be in a range from 10 seconds to 240 minutes, although lesser and greater durations can be employed. The metallic material diffuses downward through at least a portion of the semiconductor channel 60. The metallic material diffuses through the semiconductor channel 60 during the anneal process to crystallize the amorphous or polycrystalline semiconductor material of the semiconductor channel. Specifically, the metallic material diffuses downward from a top portion of the semiconductor channel 60 to a bottommost portion of the semiconductor channel 60 during the anneal. In one embodiment, the metallic material can diffuse through the entire height of the semiconductor channel 60 to the bottom portion of the semiconductor channel 60. The metallic material induces crystallization of the amorphous or polycrystalline semiconductor material in the semiconductor channel 60 into a crystalline semiconductor material portion. The crystallization of the semiconductor material is a catalytic process that does not consume any of the metallic material. The metallic material passes through the crystallized portions of the semiconductor material. In other words, the semiconductor channel 60 is converted into a crystalline semiconductor material portion as the metallic material travels through the semiconductor channel 60.

The crystalline semiconductor material portion has a greater grain size than the amorphous or polycrystalline material of the semiconductor channel 60 prior to crystallization. The average grain size of the crystalline semiconductor material portion formed by the anneal process can be greater than the lateral thickness of the semiconductor channel 60, and can be greater than 3 times the lateral thickness of the semiconductor channel 60. The crystalline semiconductor material portion can be polycrystalline.

A metal semiconductor alloy region 161 is formed at the bottom portion of the semiconductor channel 60 after the anneal process. The metal semiconductor alloy region 161 includes an alloy of the metallic material from the metallic material layer 160 and the semiconductor material of the semiconductor channel 60 (e.g., nickel silicide or cobalt silicide). Alternatively, at least a portion of the region 161 may comprise a pure metal (e.g., nickel or cobalt) rather than an alloy. In one embodiment, the metal semiconductor alloy region 161 can have an annular shape with an opening therein. Remaining portions of the metallic material layer 160 located above the alternating stack (32, 142) and the memory stack structure (50, 60, 62) can be subsequently removed, for example, by an etch process such as a wet etch.

Figure 6:
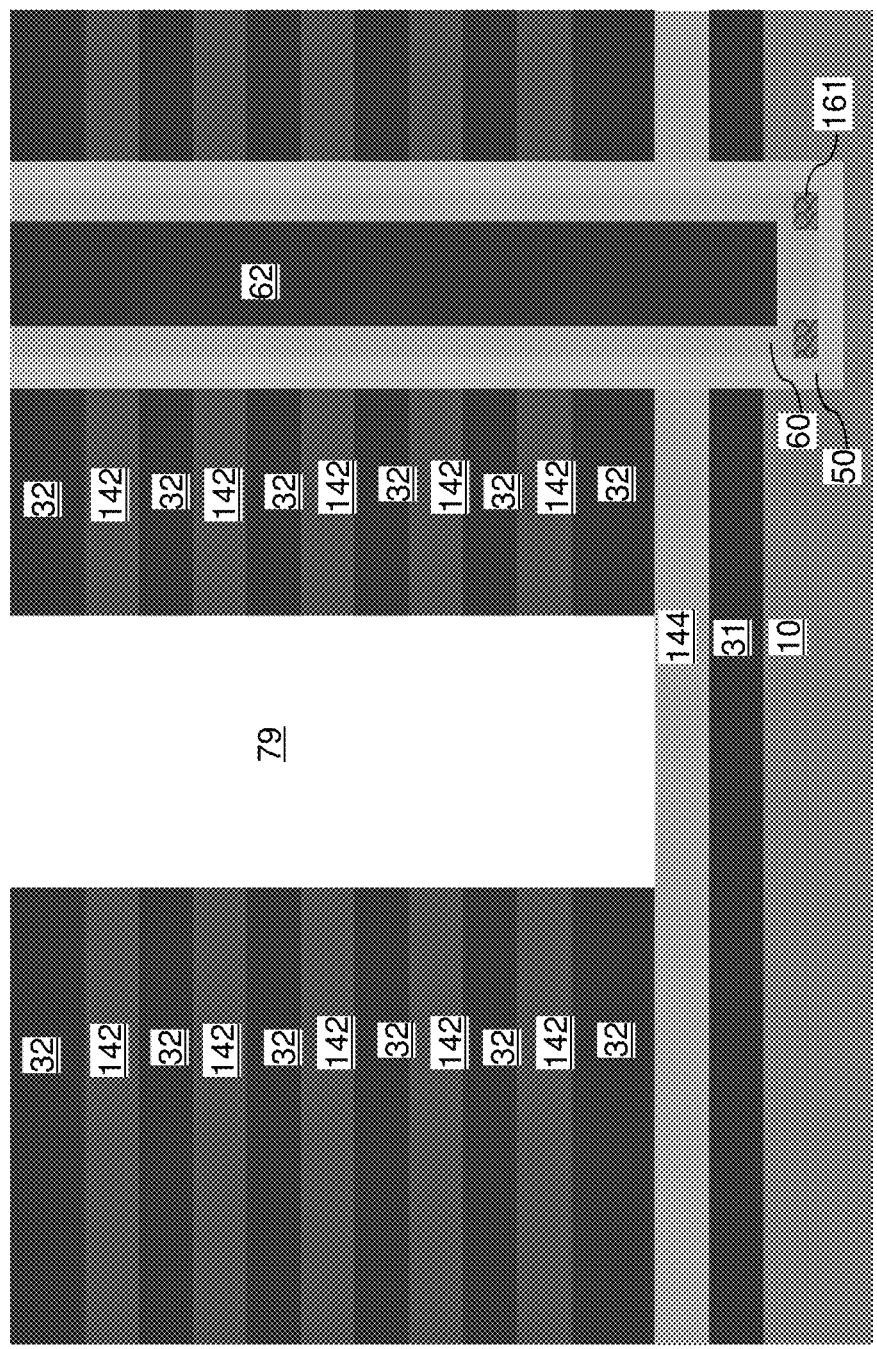
FIG. 6 is a vertical cross-sectional view of the first exemplary structure after formation of a backside contact trench according to the first embodiment of the present disclosure.

Referring to FIG. 6, a backside contact trench 79 can be formed through the alternating stack (32, 142), for example, by application and patterning of a photoresist layer to form an opening, and by an anisotropic etch that transfers the pattern of the opening through the alternating stack (31, 142). In one embodiment, the temporary material layer 144 can be employed as an etch stop layer. The photoresist layer can be subsequently removed, for example, by ashing.

Figure 7:
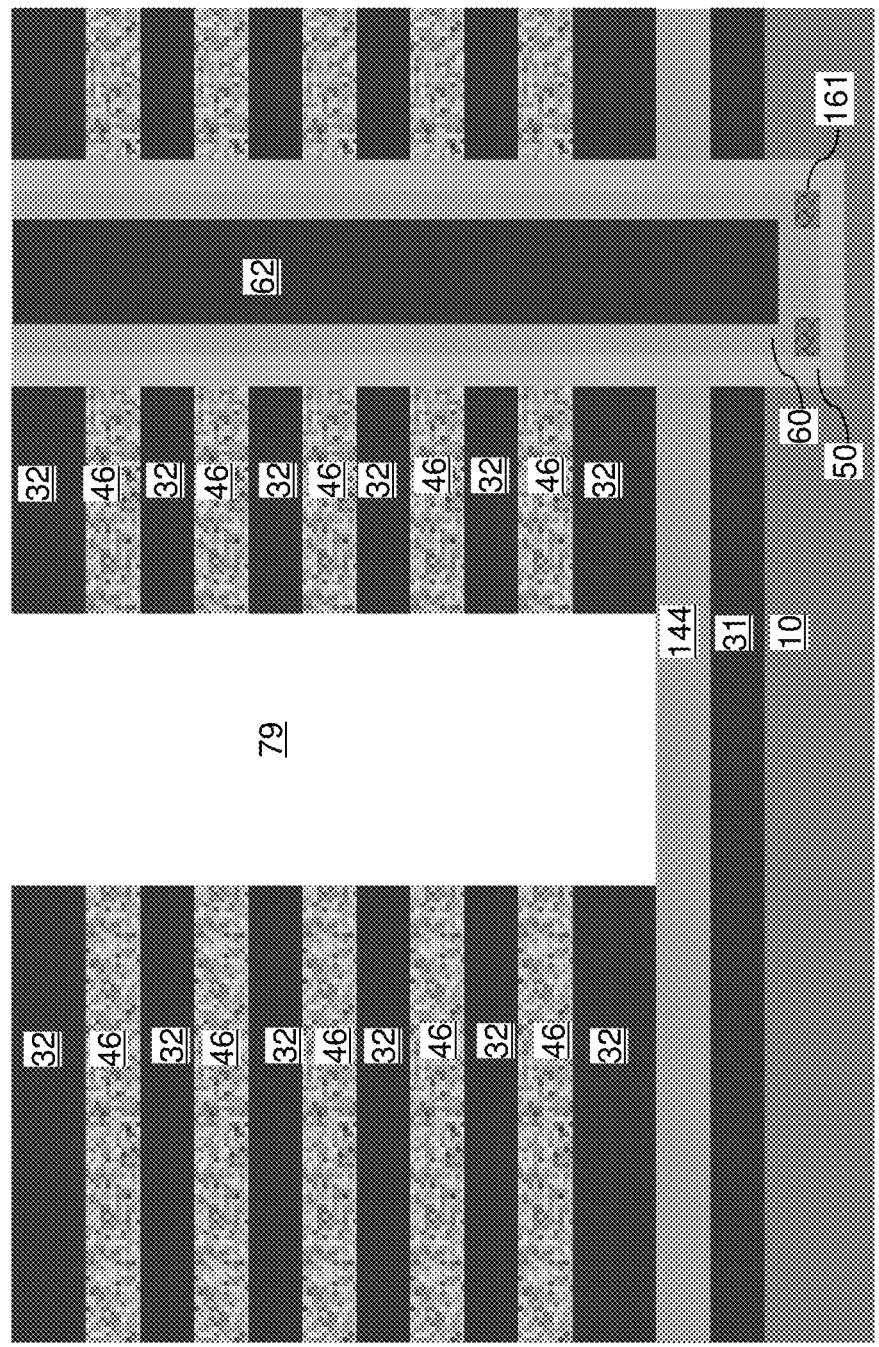
FIG. 7 is a vertical cross-sectional view of the first exemplary structure after formation of electrically conductive layers by replacement of second material layers according to the first embodiment of the present disclosure.

Referring to FIG. 7, if the second material layers 142 are not conductive material layers, the second material layers 142 can be replaced with conductive material layers 46. In this case, the second material layers 142 are removed selective to the first material layers 32 and the temporary material layer 144 employing an isotropic etch process such as a wet etch process. For example, if the second material layers 142 comprise silicon nitride, the first material layers 32 comprise silicon oxide, and the temporary material layer 144 comprises a silicon-germanium alloy or polysilicon, the second material layers 142 can be removed by a wet etch employing hot phosphoric acid. Backside recesses can be formed in the volumes from which the second material layers 142 are removed.

Subsequently, at least one conductive material (which is different from the material of the temporary material layer 144) can be deposited in the backside cavities to form the conductive material layers 46. The conductive material layers 46 can include a combination of a metallic barrier material such as TiN, TaN, WNx, and a metallic material such as W, Ti, Ta, Cu, Al, Ag, Au, a combination or an alloy thereof, and/or a conductive compound thereof. For example, the conductive material layer 46 can include a metallic nitride (such as titanium nitride) and tungsten. Portions of the conductive material deposited within the backside contact trench 79 or above the top surface of the topmost first material layer 32 can be removed, for example, by an isotropic etch. In embodiments in which the second material layers 142 are conductive material layers, replacement of the second material layers 142 with new conductive material layers can be omitted. The conductive material layers 46 can comprise a plurality of control gate electrodes of a vertical NAND device. Optionally, a subset of the electrically conductive layers 46 can comprise source select gate electrodes or drain select gate electrodes. In one embodiment, a plurality of control gate electrodes can be formed around the memory film 50 at each level that corresponds to a respective second material layer 142.

Figure 8:
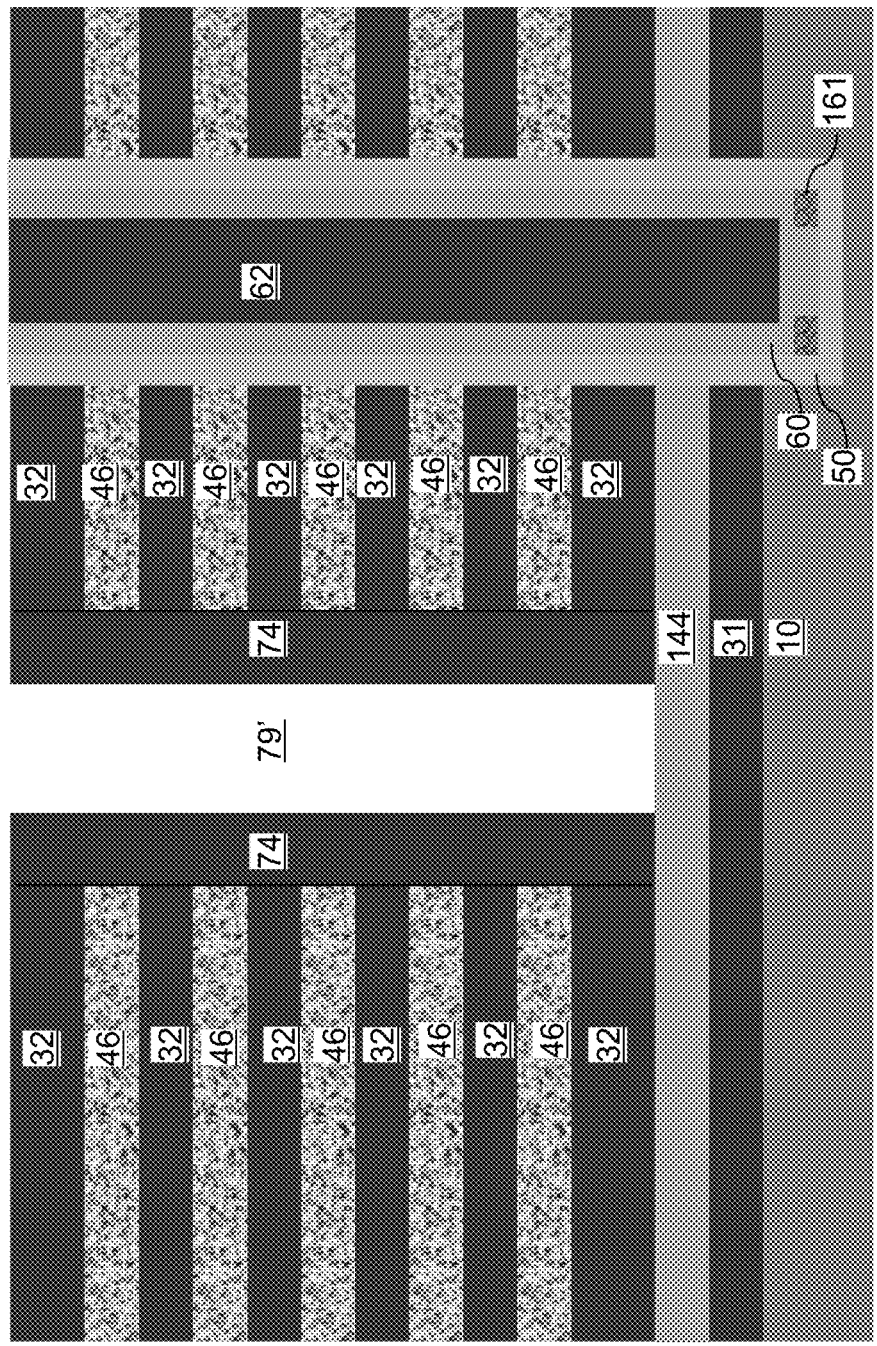
FIG. 8 is a vertical cross-sectional view of the first exemplary structure after formation of an insulating spacer according to the first embodiment of the present disclosure.

Referring to FIG. 8, an insulating spacer 74 can be formed at the periphery of the backside contact trench 79. The insulating spacer 74 can be formed, for example, by conformal deposition of an insulating material layer and an anisotropic etch that removes horizontal portions of the insulating material layer. The insulating spacer 74 comprises a dielectric material such as silicon oxide. The thickness of the insulating spacer 74 can be in a range from 3 nm to 60 nm, although lesser and greater thicknesses can also be employed. The insulating spacer 74 laterally surrounds a cavity 79'.

Figure 9:
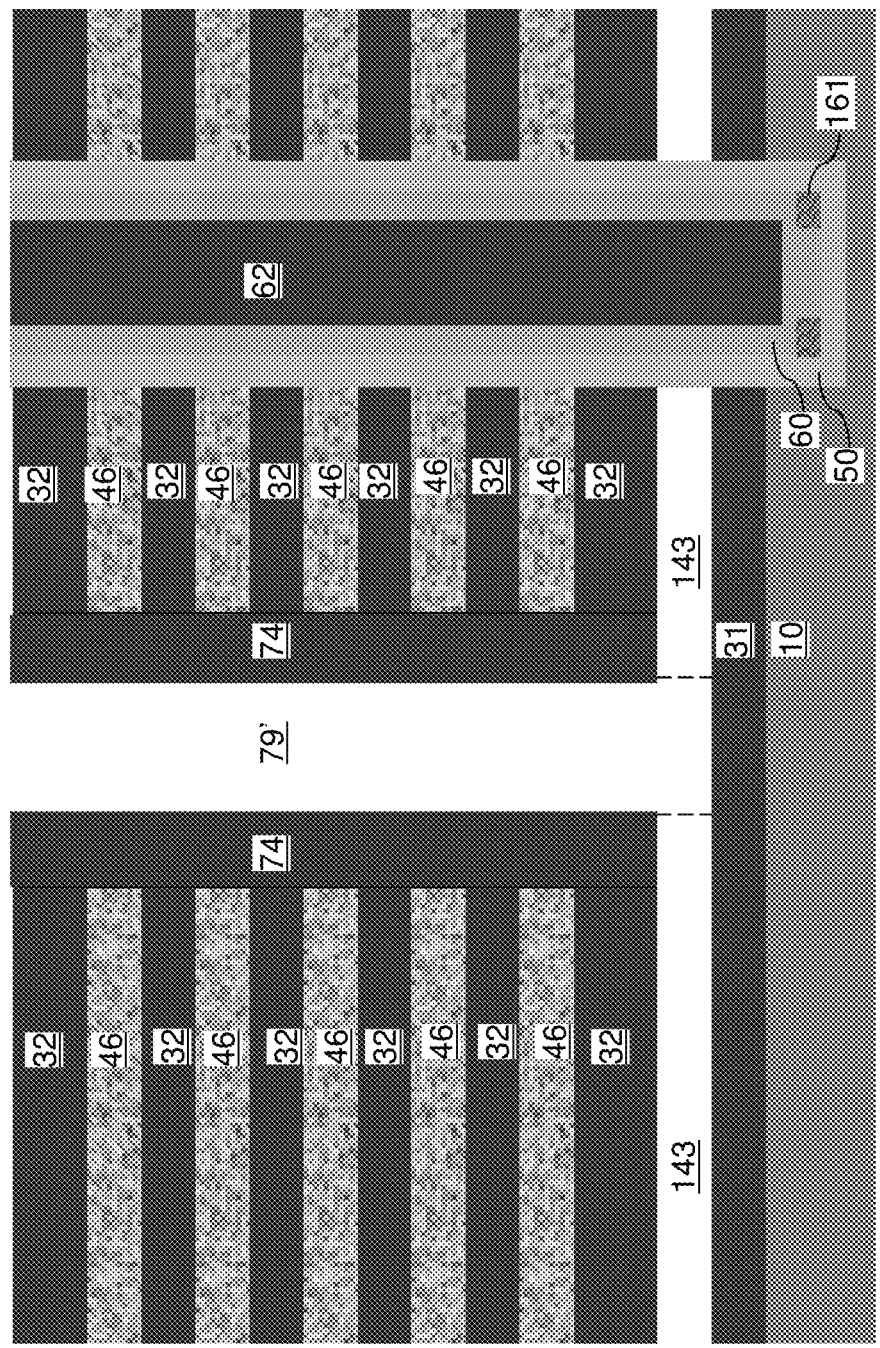
FIG. 9 is a vertical cross-sectional view of the first exemplary structure after removal of a temporary material layer according to the first embodiment of the present disclosure.

Referring to FIG. 9, the temporary material layer 144 can be removed selective to the materials of the first material layers 32 (which can be insulator layers), the insulating spacer 74, and the bottom insulator layer 31. An isotropic etch such as a wet etch process can be employed to remove the temporary material layer 144 selective to the materials of the first material layers 32, the insulating spacer 74, and the bottom insulator layer 31. A laterally-extending cavity 143 is formed in the volume from which the temporary material layer 144 is removed. The laterally-extending cavity 143 is connected to the cavity 79' within the backside contact trench.

Figure 10:
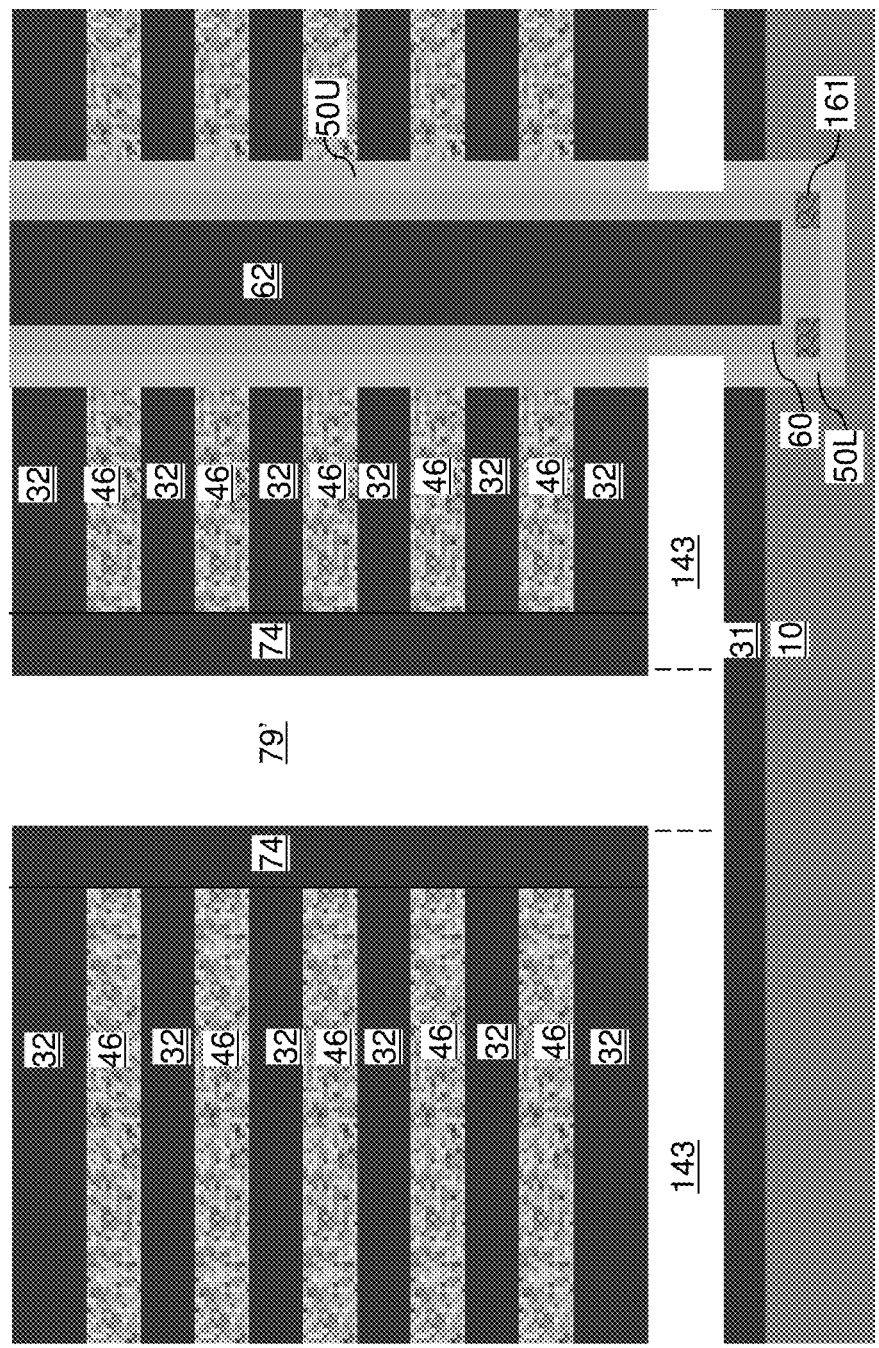
FIG. 10 is a vertical cross-sectional view of the first exemplary structure after removal of an annular portion of the blocking dielectric layer according to a first embodiment of the present disclosure.

Referring to FIG. 10, a portion of the memory film 50 adjacent to the laterally-extending cavity 143 can be etched selective to the semiconductor material of the semiconductor channel 60 to physically expose a surface of the semiconductor channel 60, i.e., a portion of the outer sidewall of the semiconductor channel 60. The memory film 50 is divided into two disjoined portions, which include an upper memory film portion 50U located above the laterally-extending cavity 143 and a memory film located below the laterally-extending cavity 143, which is herein referred to as a lower memory film portion 50L.

Figure 11:
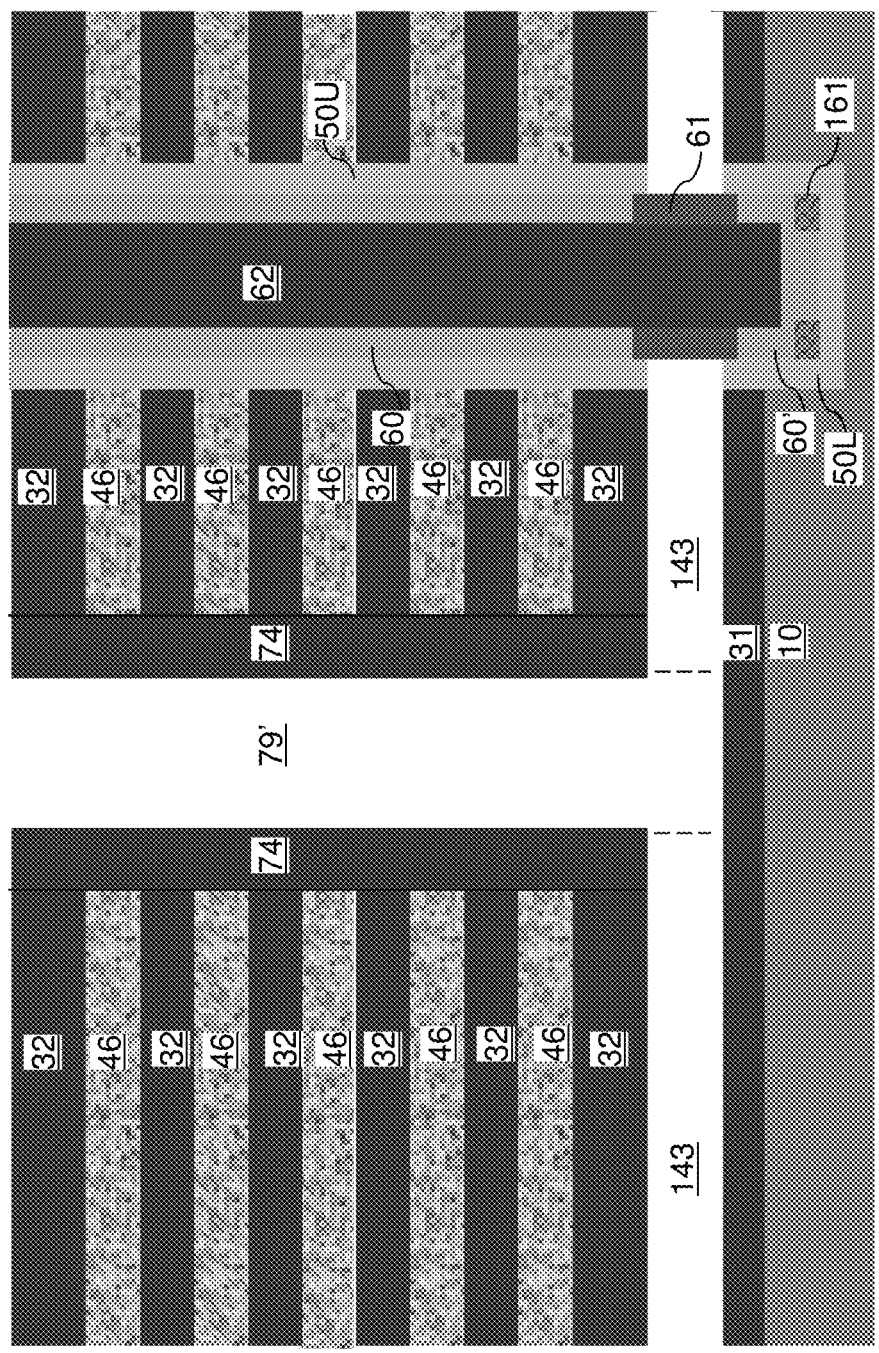
FIG. 11 is a vertical cross-sectional view of the first exemplary structure after formation of a source region according to the first embodiment of the present disclosure.

Referring to FIG. 11, a source region 61 can be formed by providing electrical dopants (i.e., p-type dopants or n-type dopants) into a physically exposed portion of the semiconductor channel 60. The source region 61 can be formed by plasma doping or gas phase doping. In one embodiment, the semiconductor channel 60 can have a doping of a first conductivity type, and the source region 61 can have a doping of a second conductivity type that is the opposite of the first conductivity type. In another embodiment, the semiconductor channel 60 can be intrinsic, and the source region 61 can have a p-type doping or n-type doping. The source region 61 is an annular region of the crystalline semiconductor material portion (which constitutes the semiconductor channel 60 prior to implantation of the electrical dopants). The region of the crystalline semiconductor material portion that constitutes the source region 61 can be located underneath the plurality of control gate electrodes that are embodied as portions of the electrically conductive layers 46. The remaining portion of the semiconductor channel 60 located underneath the source region 61 is herein referred to as a crystalline semiconductor material portion 60'.

Figure 12:
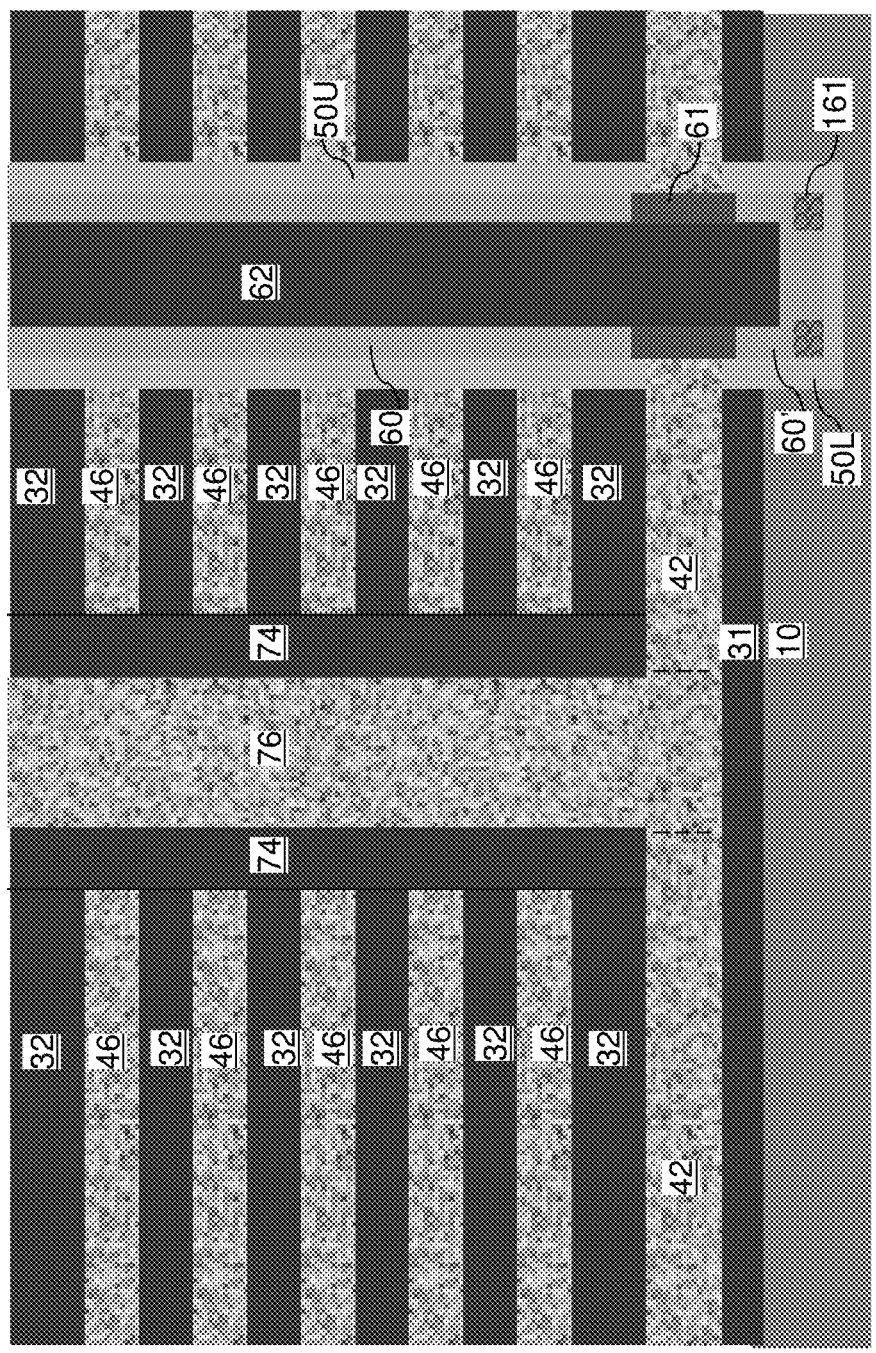
FIG. 12 is a vertical cross-sectional view of the first exemplary structure after formation of an integrated via and layer structure according to a first embodiment of the present disclosure.

Referring to FIG. 12, at least one conductive material is deposited on the physically exposed surface of the source region 61 (which is a region of the crystalline semiconductor material portion). The at least one conductive material can be removed from above a horizontal plane including the top surface of the topmost insulator layer 32. The at least one conductive material can include a metallic material such as W, Ti, Ta, Cu, Al, Ag, Au, a combination or an alloy thereof, and/or a conductive compound thereof. For example, the at least one conductive material can include a metallic nitride (such as titanium nitride) and tungsten. The remaining portion of the at least one conductive material constitutes an integrated via and layer structure (76, 42), which includes a backside contact via structure 76 and a bottom conductive layer 42. The integrated via and layer structure (76, 42) contacts a region of the crystalline semiconductor material portion (i.e., the source region 61) and extends along a vertical direction through the alternating stack (32, 46) and along a direction parallel to the top surface of the substrate 10, i.e., along a horizontal direction.

The first exemplary structure can be a three-dimensional memory device that comprises a vertical NAND device formed in a device region. The electrically conductive layers 46 can be formed at levels corresponding to the second material layers 142, and the electrically conductive layers 46 can comprise, or can be electrically connected to, a respective word line of the NAND device.

In one embodiment, the device region can comprise a plurality of memory stack structures (50U, 50L, 60, 60', 61, 62). In this case, the device region can comprise a plurality of semiconductor channels 60. At least one end portion of each of the plurality of semiconductor channels 60 extends substantially perpendicular to the top surface of the substrate 10. The device region can comprise a plurality of charge storage regions such that each charge storage region located adjacent to a respective one of the plurality of semiconductor channels 60 and within a respective portion of the memory film (50U, 50L). The device region can comprise a plurality of control gate electrodes having a strip shape extending substantially parallel to the top surface of the substrate 10. The plurality of control gate electrodes can comprise at least a first control gate electrode located in a first device level and a second control gate electrode located in a second device level. The electrically conductive layers 46 in the stack (32, 46) can be in electrical contact with the plurality of control gate electrode and extend from the device region to a contact region including a plurality of electrically conductive via connections, which are contact via structures providing electrical connection. The substrate 10 can comprise a silicon substrate containing a driver circuit for the NAND device.

The first exemplary structure can comprise a three-dimensional memory device. The three-dimensional memory device comprises a stack (32, 46) including an alternating plurality of insulator layers 32 and electrically conductive layers 46 and located over a top surface of a substrate 10, an opening (i.e., a memory opening 49) extending through the stack (32, 46), a memory film (50U, 50L) located in the opening, a contiguous semiconductor material portion (60', 61, 60) located over the memory film (50U, 50L) in the opening and comprising a semiconductor channel 60 that includes a portion that extends substantially perpendicular to the top surface of the substrate 10, and a metal semiconductor alloy region 161 in contact with a bottom surface of the contiguous semiconductor material portion (60', 61, 60). The contiguous semiconductor material portion (60', 61, 60) is electrically isolated from the substrate by the memory film (50U, 50L). The metal semiconductor alloy region 161 can contact a top surface of a horizontal portion of the memory film (50U, 50L). The metal semiconductor alloy region 161 can comprise an alloy of a metal and a semiconductor material of the contiguous semiconductor material portion (60', 61, 60). The contiguous semiconductor material portion (60', 61, 60) comprises a crystalline semiconductor material. An integrated via and layer structure (76, 42) is present, which comprises a vertical portion that extends through the stack (32, 46) and a horizontal portion that contacts a region (e.g., a source region 61) of the contiguous semiconductor material portion (60', 61, 60) and extending along a direction parallel to a top surface of the substrate 10. The electrically conductive layers 46 can be located above the level of the horizontal portion of the integrated via and layer structure (76, 42). The region of the contiguous semiconductor material portion (60', 61, 60) can be a source region having electrical dopants of an opposite conductivity type than electrical dopants within the semiconductor channel 60.

Figure 13:
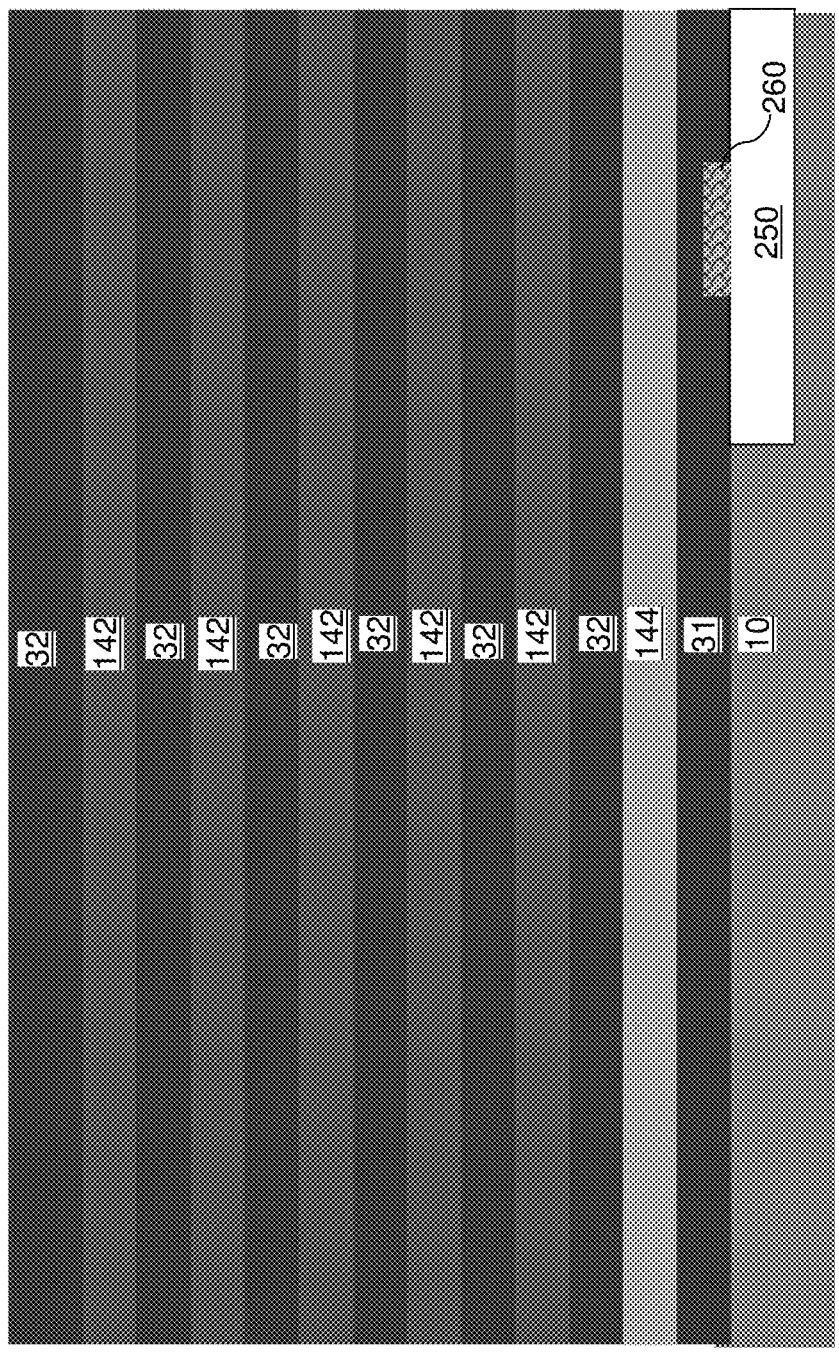
FIG. 13 is a vertical cross-sectional view of a second exemplary structure after formation of a metallic material portion and a stack of an alternating plurality of first material layers and second material layers according to a second embodiment of the present disclosure.

Referring to FIG. 13, a second exemplary structure can be formed by providing a substrate 10. A dielectric material portion 250 can be optionally formed within, or on, a region of the substrate 10. The dielectric material portion 250, if present, includes a dielectric material such as silicon oxide or silicon nitride. A metallic material portion 260 can be formed over the substrate 10. If a dielectric material portion 250 is present, the metallic material portion 260 can be formed directly on the top surface of the dielectric material portion 250.

The metallic material portion 260 comprises a transition metal element, a combination of two or more transition metal elements, an oxide thereof, and/or a nitride thereof. The metallic material portion 260 includes a transition metal element that can induce crystallization of a semiconductor material in a subsequent anneal process. For example, in case the semiconductor material comprises polysilicon, amorphous silicon, a polycrystalline silicon-germanium alloy, or an amorphous silicon-germanium alloy, the metallic material portion 260 can comprise a material such as nickel, cobalt, other suitable metals and alloys thereof, such as nickel oxide, nickel silicide and/or cobalt silicide. The metallic material portion 260 can be formed, for example, by physical vapor deposition (PVD) or by chemical vapor deposition (CVD). The thickness of the metallic material portion 260 can be in a range from 1 nm to 30 nm, although lesser and greater thicknesses can also be employed.

A bottom insulator layer 31, a temporary material layer 144, and a stack of an alternating plurality of first material layers 32 and second material layers 142 can be subsequently formed over the metallic material portion 160 employing the same methods as in the first embodiment.

Figure 14:
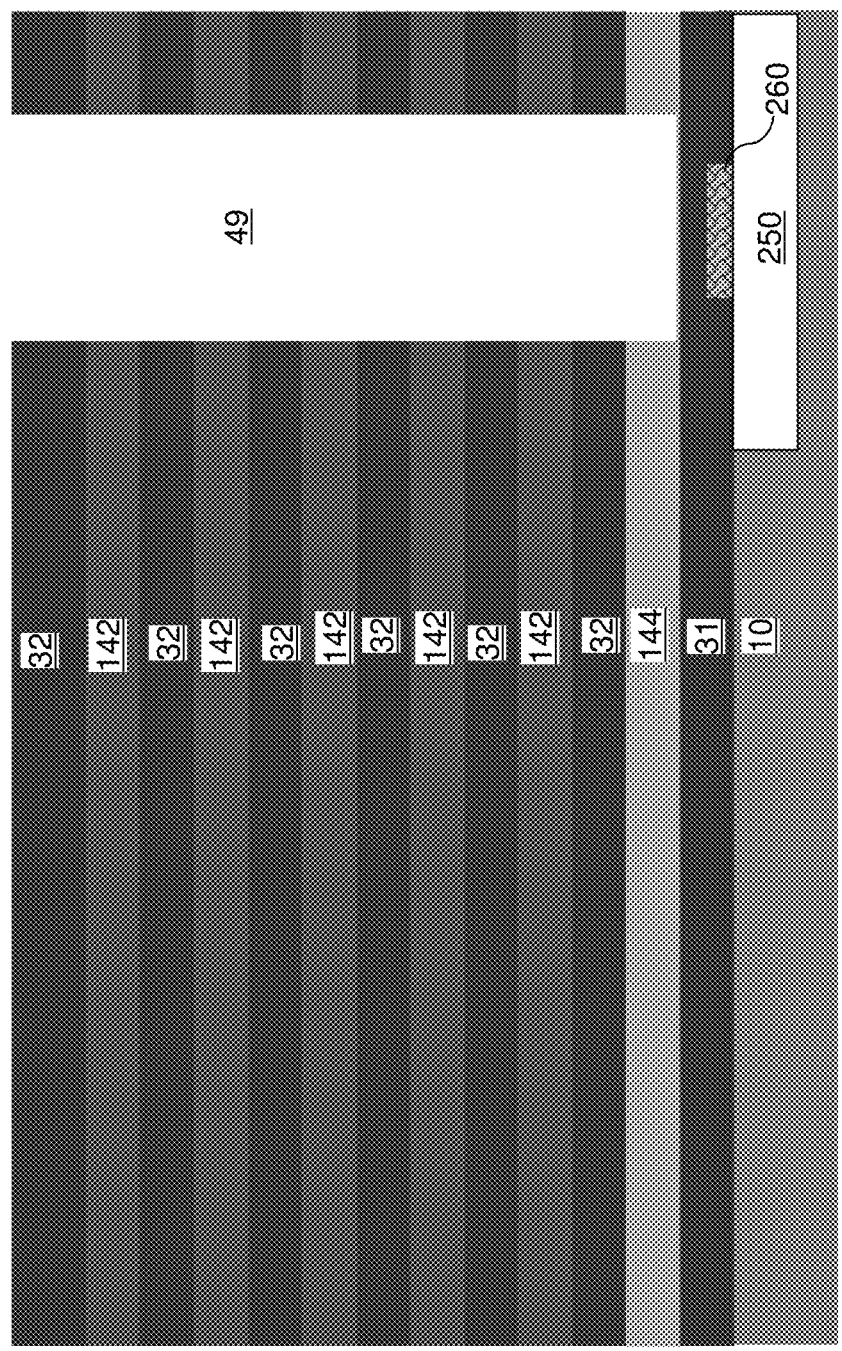
FIG. 14 is a vertical cross-sectional view of the second exemplary structure after formation of a memory opening according to the second embodiment of the present disclosure.

Referring to FIG. 14, a memory hole 49 can be formed through the alternating stack (32, 142) and the temporary material layer 144. A photoresist layer (not shown) can be applied and patterned over the alternating stack (32, 142) to form an opening therein, and the pattern of the opening can be transferred through the alternating stack (32, 142) and the temporary material layer 144 employing an anisotropic etch. While one memory opening 49 is illustrated in the drawings, embodiments are expressly contemplated in which a plurality of memory holes 49 is formed. The plurality of memory holes 49 can be arranged in an array configuration. Optionally, the bottom insulator layer 31 can be employed as an etch stop layer.

Figure 15:
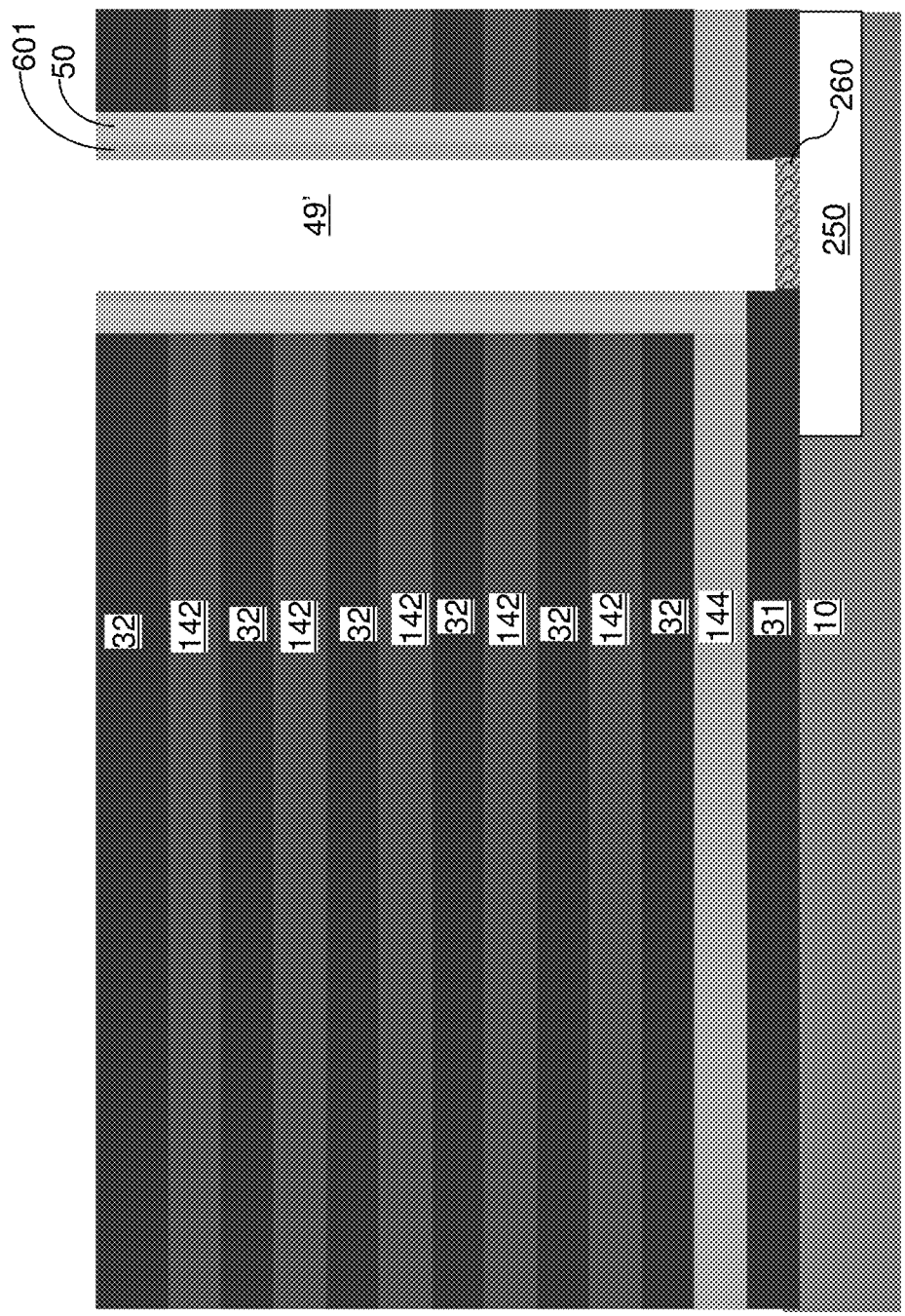
FIG. 15 is a vertical cross-sectional view of the second exemplary structure after formation of a memory film and a first semiconductor channel layer according to the second embodiment of the present disclosure.

Referring to FIG. 15, a memory film 50 can be formed by conformal deposition of material layers. The memory film 50 can have the same layer stack as in the first embodiment. A first semiconductor channel layer 601 including a semiconductor material can be deposited by a conformal deposition method such as low pressure chemical vapor deposition (LPCVD). The first semiconductor channel layer 601 can include any material that can be employed for the semiconductor channel 60 of the first embodiment. The thickness of the first semiconductor channel layer 601 can be in a range from 1 nm to 10 nm, although lesser and greater thicknesses can also be employed. The first semiconductor channel layer 601 can be formed on an inner sidewall of the memory film 50.

An anisotropic etch is performed to remove horizontal portions of the memory film 50 and the first semiconductor channel layer 601. The memory opening 49 is extended through bottom portions of the first semiconductor channel layer 601 and the memory film 50 and to a top surface of the metallic material portion 260. A portion of the bottom insulator layer 31 underlying a cavity 49' in the memory opening is anisotropically etched during vertical extension of the cavity 49'. In one embodiment, the metallic material portion 260 can be employed as a stopping structure for the anisotropic etch process. The metallic material portion 260 can be located directly underneath the cavity 49'.

Figure 16:
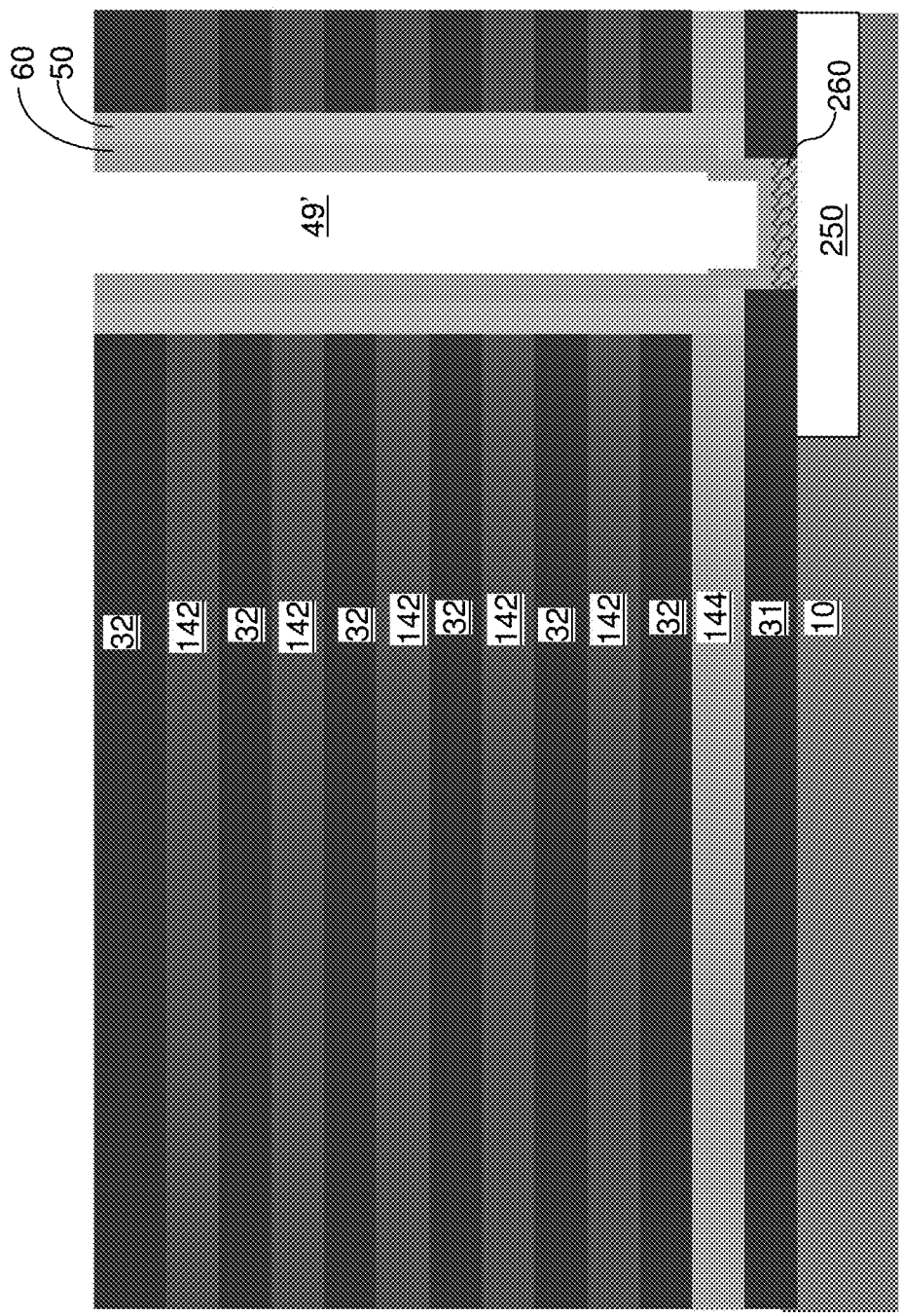
FIG. 16 is a vertical cross-sectional view of the second exemplary structure after formation of a semiconductor channel according to the second embodiment of the present disclosure.

Referring to FIG. 16, a semiconductor channel 60 can be formed by depositing a second semiconductor layer directly on the first semiconductor layer 601 and the metallic material portion 260. The second semiconductor channel layer is formed directly on the first semiconductor channel layer 601 and the metallic material portion 260. The first and second semiconductor channel layers collectively constitute the semiconductor channel 60. The second semiconductor channel layer can comprise any material that can be employed for the semiconductor channel 60 of the first embodiment. The second semiconductor material layer may have the same composition as, or may have a composition different from, the first semiconductor material layer. The sum of the thickness of the first semiconductor material layer and the thickness of the second semiconductor layer can be in a range from 2 nm to 20 nm, although lesser and greater thicknesses can also be employed.

Referring to FIG. 16, an anneal at an elevated temperature is performed to diffuse the metallic material of the metallic material layer 160 upward. The elevated temperature of the anneal process can be in a range from 400 degrees Celsius to 1,000 degrees Celsius, although lesser and greater temperatures can also be employed. The duration of the anneal can be in a range from 10 seconds to 240 minutes, although lesser and greater durations can be employed. The metallic material diffuses upward through at least a portion of the semiconductor channel 60. The metallic material diffuses through the semiconductor channel 60 during the anneal process to crystallize the amorphous or polycrystalline semiconductor material of the semiconductor channel. Specifically, the metallic material diffuses upward from below the semiconductor channel 60 to an inner sidewall of the semiconductor channel 60 during the anneal. In one embodiment, a portion of the metallic material can diffuse through the entire height of the semiconductor channel 60 to the topmost portion of the semiconductor channel 60. The metallic material induces crystallization of the amorphous or polycrystalline semiconductor material in the semiconductor channel 60 into a crystalline semiconductor material portion. In other words, the semiconductor channel 60 is converted into a crystalline semiconductor material portion as the metallic material travels through the semiconductor channel 60.

The crystalline semiconductor material portion has a greater grain size than the amorphous or polycrystalline material of the semiconductor channel 60 prior to crystallization. The average grain size of the crystalline semiconductor material portion formed by the anneal process can be greater than the lateral thickness of the semiconductor channel 60, and can be greater than 3 times the lateral thickness of the semiconductor channel 60. The crystalline semiconductor material portion can be polycrystalline.

A metal semiconductor alloy region 261 can be formed over a top portion of the semiconductor channel 60 after the anneal process. In one embodiment, the metal semiconductor alloy region 261 can contiguously extend along the inner sidewall of the semiconductor channel 60 to contact the entirety of the inner sidewall of the semiconductor channel 60. The metal semiconductor alloy region 261 includes an alloy of the metallic material from the metallic material portion 260 and the semiconductor material of the semiconductor channel 60. The entirety of the metal semiconductor alloy region 261 can be a single contiguous structure. In one embodiment, the region between the bottom surface of the semiconductor channel 60 and the substrate 10 can be substantially free of the metallic material.

Figure 17:
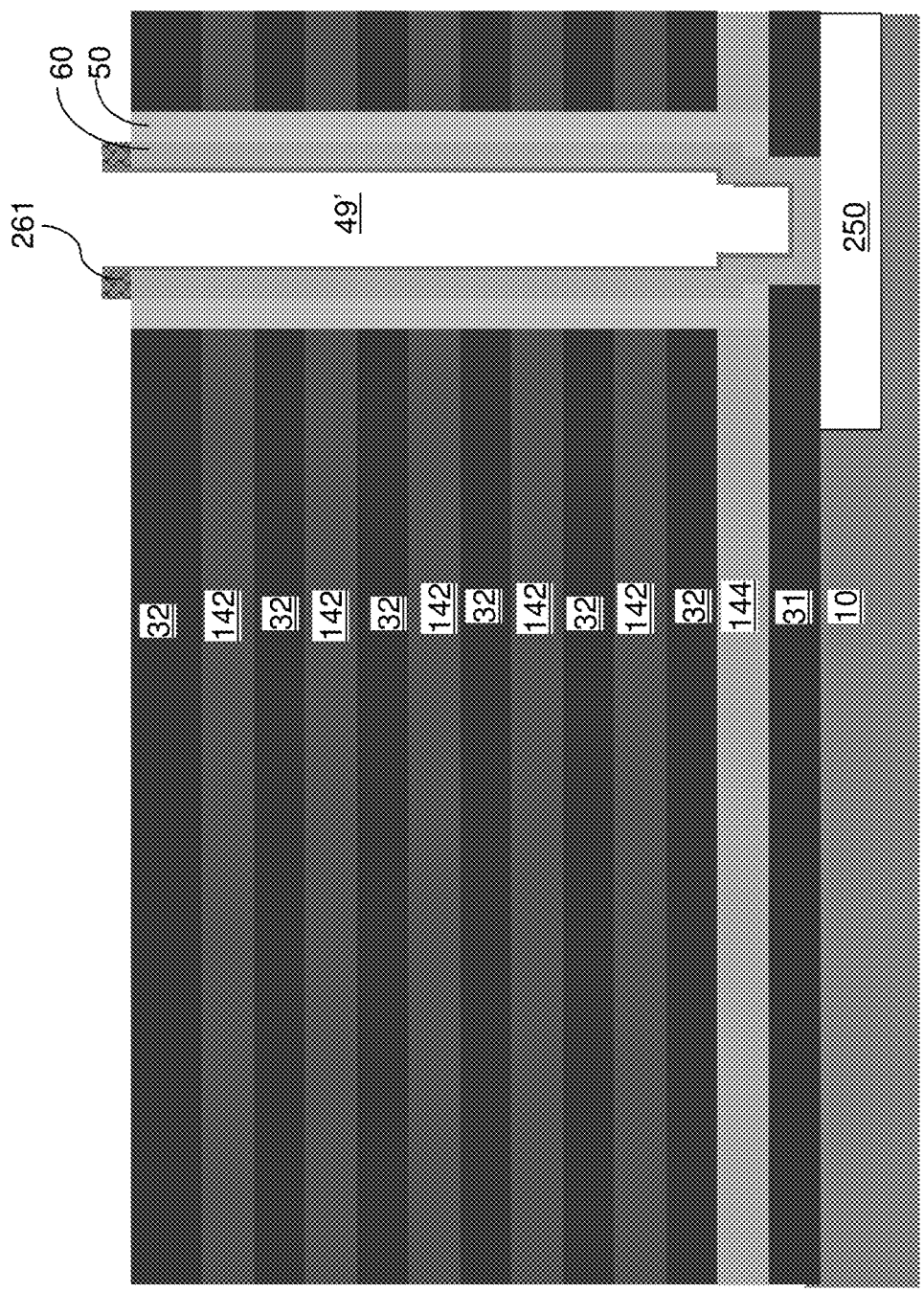
FIG. 17 is a vertical cross-sectional view of the second exemplary structure after an anneal process that diffuses the metallic material through the semiconductor channel according to the second embodiment of the present disclosure.

Referring to FIG. 17, the metal semiconductor alloy region 261 can be removed by an isotropic etch such as a wet etch. A wet etch chemistry that removes a metallic material (e.g., pure Ni or Co, or their silicide) selective to semiconductor materials can be employed to remove the metal semiconductor alloy region 261. The entire surfaces of the semiconductor channel 60 can be substantially free of any metallic material. As used herein, a surface is "substantially free of" of a material if the concentration of the material on the surface is below trace level, e.g., below 1 part per million (such as below 10 parts per billion).

Figure 18:
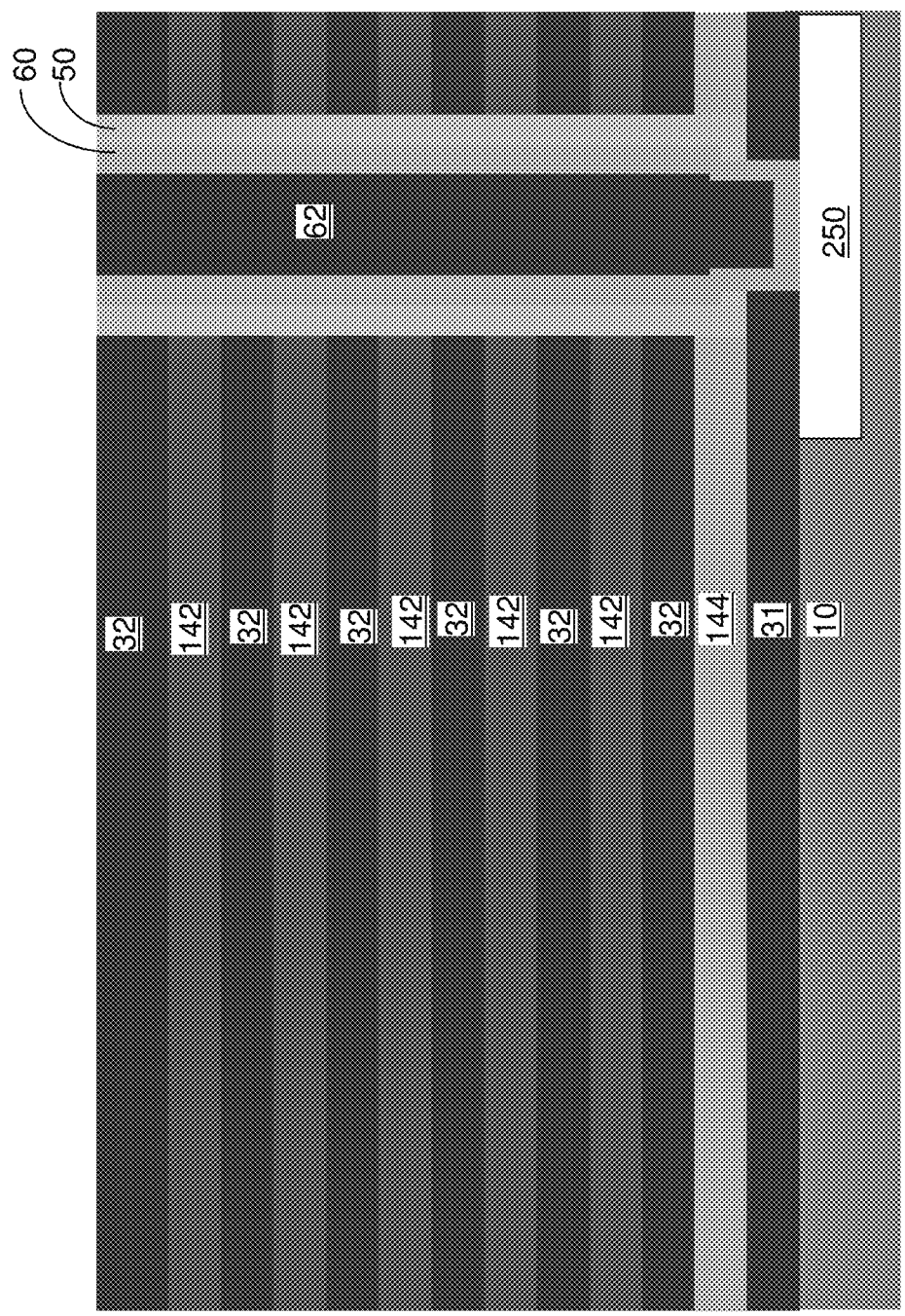
FIG. 18 is a vertical cross-sectional view of the second exemplary structure after removal of the metallic material and formation of a dielectric core according to the second embodiment of the present disclosure.

Referring to FIG. 18, a dielectric material is deposited in the cavity 49' to form a dielectric core 62. The dielectric core 62 can have the same composition as in the first embodiment. Excess portions of the dielectric material deposited to form the dielectric core 62 can be removed from above the horizontal plane including the top surface of the topmost insulator layer 32 by a planarization process (such as chemical mechanical planarization).

Figure 19:
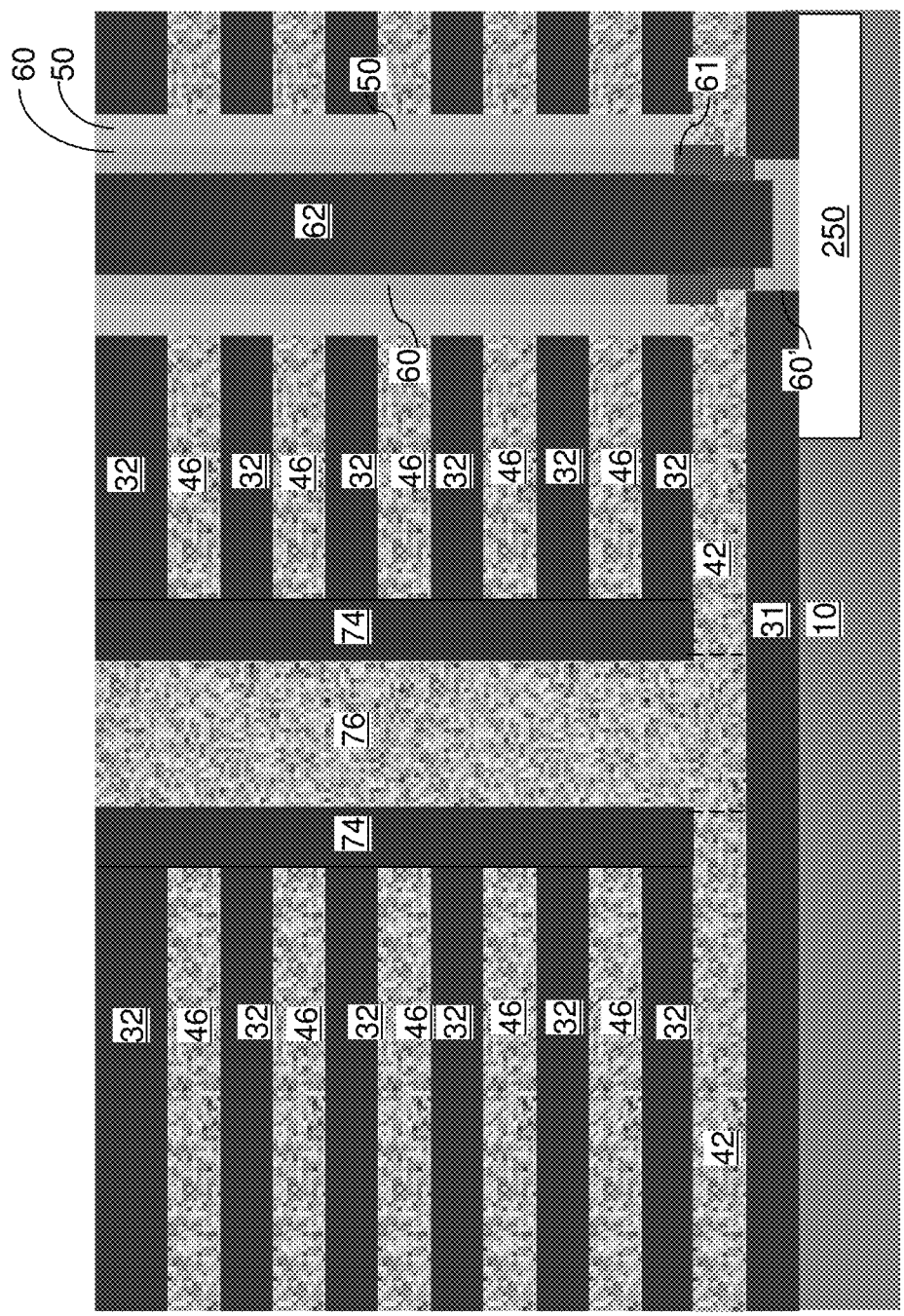
FIG. 19 is a vertical cross-sectional view of the second exemplary structure after formation of an integral via and layer structure according to the second embodiment of the present disclosure.

Subsequently, the processing steps of FIGS. 6-12 of the first embodiment can be performed to form the second exemplary structure illustrated in FIG. 19. The bottommost portion of the memory film 50 can be removed in the second embodiment at a processing step that corresponds to the processing step of FIG. 10.

The second exemplary structure can be a three-dimensional memory device that comprises a vertical NAND device formed in a device region. The electrically conductive layers 46 can be formed at levels corresponding to the second material layers 142, and the electrically conductive layers 46 can comprise, or can be electrically connected to, a respective word line of the NAND device.

In one embodiment, the device region can comprises a plurality of memory stack structures (50, 60, 60', 61, 62). In this case, the device region can comprise a plurality of semiconductor channels 60. At least one end portion of each of the plurality of semiconductor channels 60 extends substantially perpendicular to the top surface of the substrate 10. The device region can comprise a plurality of charge storage regions such that each charge storage region located adjacent to a respective one of the plurality of semiconductor channels 60 and within a respective portion of the memory film 50. The device region can comprise a plurality of control gate electrodes having a strip shape extending substantially parallel to the top surface of the substrate 10. The plurality of control gate electrodes can comprise at least a first control gate electrode located in a first device level and a second control gate electrode located in a second device level. The electrically conductive layers 46 in the stack (32, 46) can be in electrical contact with the plurality of control gate electrode and extend from the device region to a contact region including a plurality of electrically conductive via connections, which are contact via structures providing electrical connection. The substrate 10 can comprise a silicon substrate containing a driver circuit for the NAND device.

Figure 20:
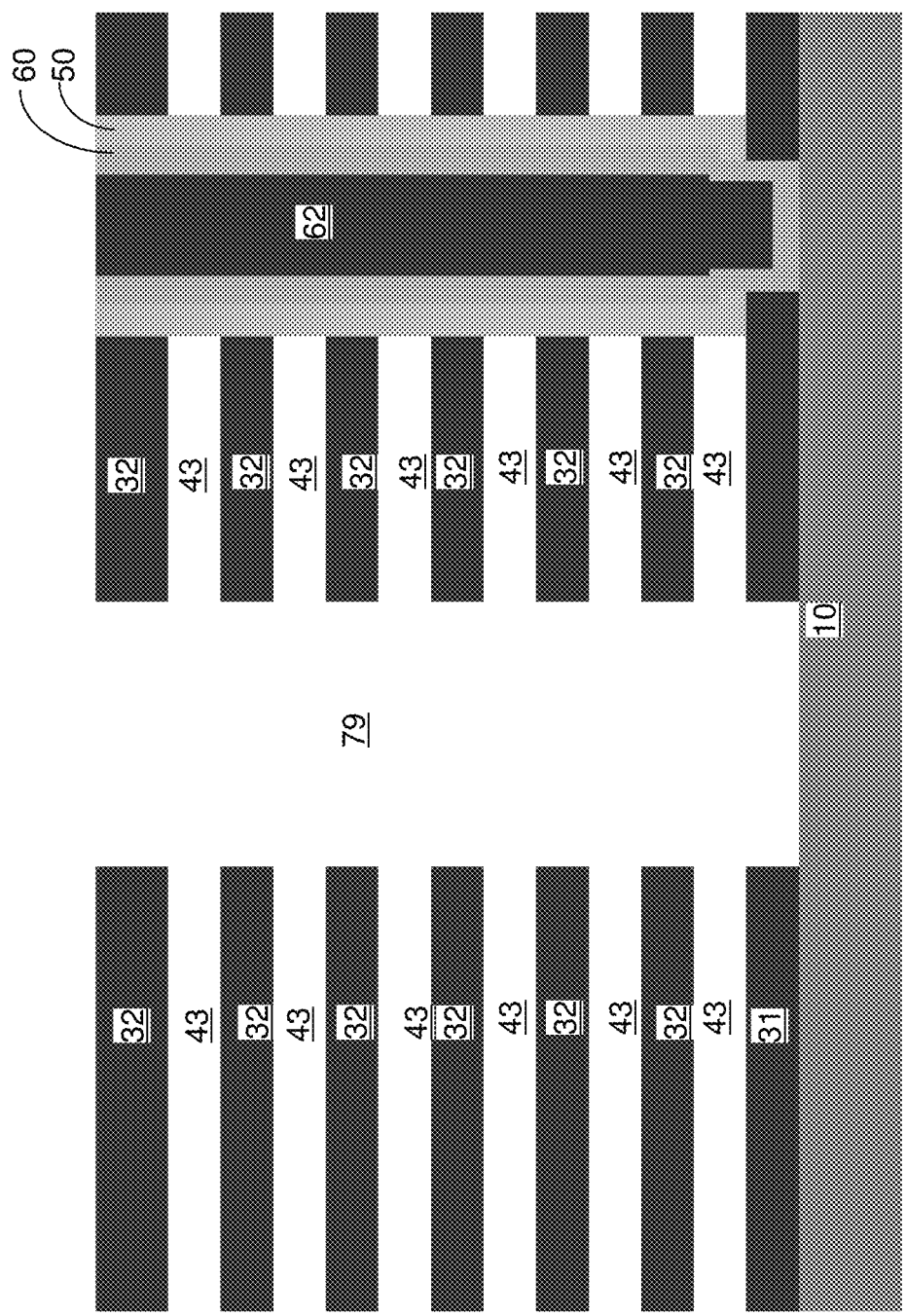
FIG. 20 is a vertical cross-sectional view of an alternate embodiment of the second exemplary structure after formation of memory a backside contact trench through the stack according to a second embodiment of the present disclosure.

Referring to FIG. 20, an alternate embodiment of the second exemplary structure can be derived from the second exemplary structure by omitting formation of a dielectric material portion 250, a bottom insulator layer 31, and a temporary material layer 144. In the alternate embodiment, the metallic material portion 260 can be formed directly on the top surface of the substrate 10.

After the processing step corresponding to the processing step of FIG. 6, the second material layers 142 can be removed selective to the first material layers 32 and the semiconductor material of the substrate 10 by a selective etch process to form backside recesses 43 in volumes from which the second material layers 142 are removed.

Figure 21:
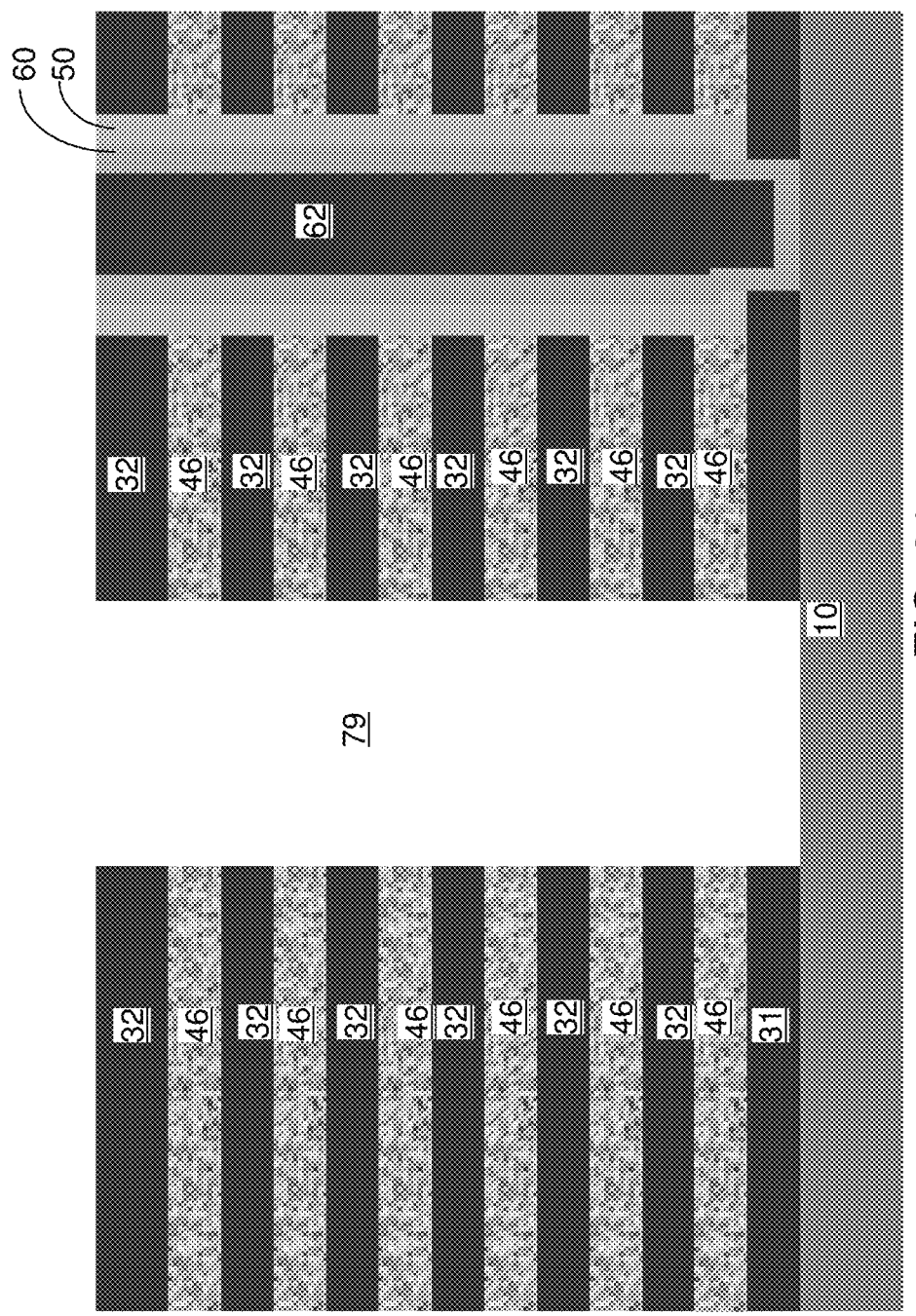
FIG. 21 is a vertical cross-sectional view of the alternate embodiment of the second exemplary structure after formation of electrically conductive layers and removal of a contiguous conductive material layer according to the second embodiment of the present disclosure.

Referring to FIG. 21, the processing steps of FIG. 7 can be performed to form electrically conductive layers 46 in the backside recesses 43. Excess portions of at least one conductive material deposited to form the electrically conductive layers 46 can be removed from within the backside contact trench 79 and from above the alternating stack of insulating layers (i.e., the first material layers 32) and the electrically conductive layers 46 by an isotropic etch process.

Figure 22:
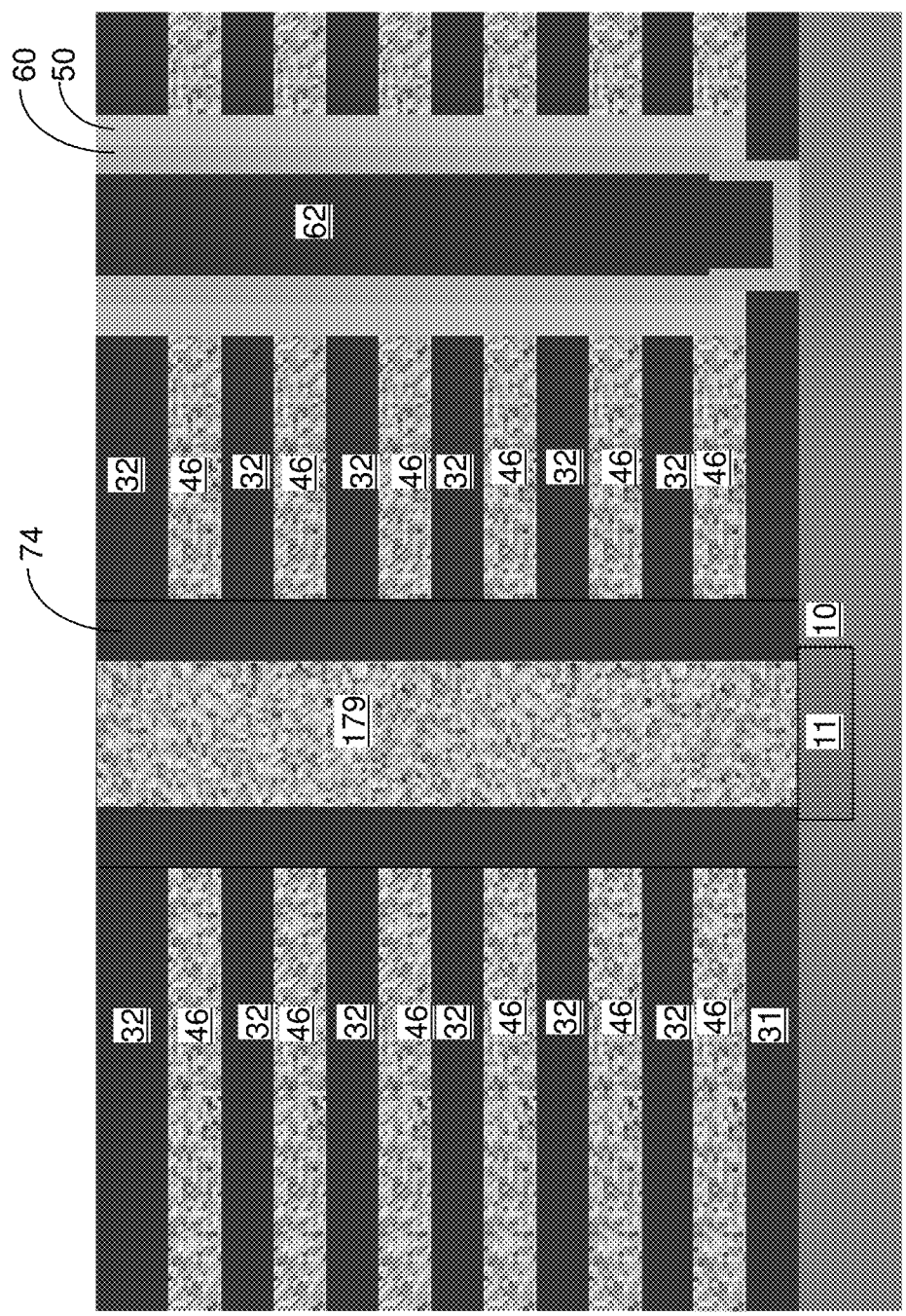
FIG. 22 is a vertical cross-sectional view of the alternate embodiment of the second exemplary structure after formation of a backside contact via structure according to the second embodiment of the present disclosure.

Referring to FIG. 22, an insulating spacer 74 can be formed in the same manner as in the first embodiment. A source region 11 can be formed in a surface portion of the substrate 10 that underlies the backside contact trench 79 by implantation of electrical dopants. The processing steps of FIG. 12 can be performed to form a backside contact via structure 179. The backside contact via structure 179 can include the same material as the integrated via and layer structure (76, 42) of the first embodiment. The semiconductor material in a horizontal portion of the substrate 10 between the source region 11 and the semiconductor channel 60 can constitute a horizontal semiconductor channel, which is an extension of the semiconductor channel 60 in the substrate 10. The alternative structure of FIG. 22 containing the backside contact via structure 179 and the horizontal semiconductor channel portion in the substrate 10 may also be used in the device of the first embodiment if layer 144 is omitted in the first embodiment.

Figure 23:
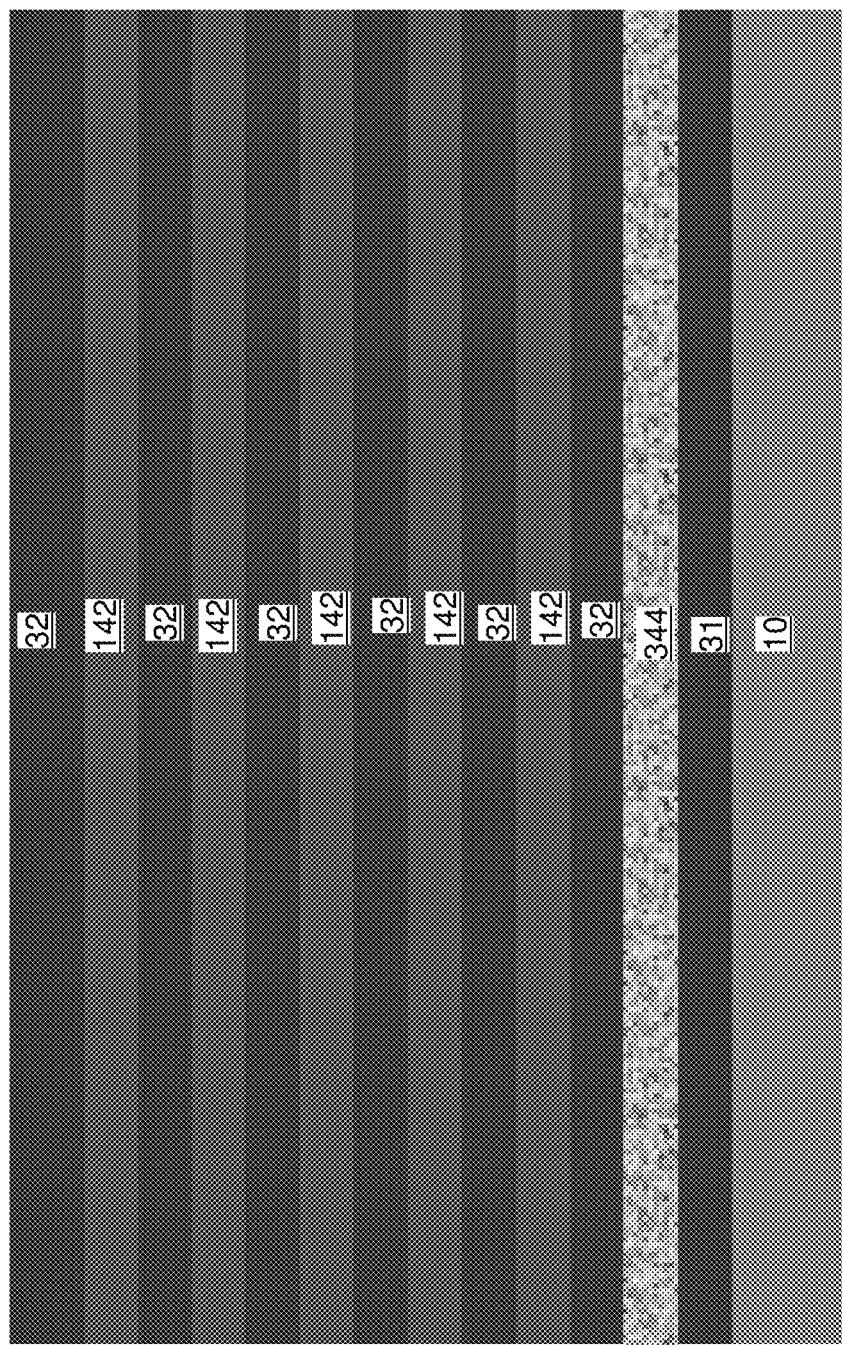
FIG. 23 is a vertical cross-sectional view of a third exemplary structure after formation of a stack of alternating layers of first material layers and second material layers according to the third embodiment of the present disclosure.

Referring to FIG. 23, a third exemplary structure according to the third embodiment of the present disclosure can be derived from the first exemplary structure by replacing the optional temporary material layer 144 with an optional conductive material layer 344. The conductive material layer 344 can include a metallic material, which can be any material that can be employed for the electrically conductive layers 46 of the first and second embodiments. Alternately, the conductive material layer 344 can comprise a doped semiconductor layer such as a doped polysilicon layer. Alternatively, the conductive material layer 344 may be omitted if the alternative structure of FIG. 22 containing the backside contact via structure 179 and the horizontal semiconductor channel portion in the substrate 10 is used in the device of the third embodiment.

Figure 24:
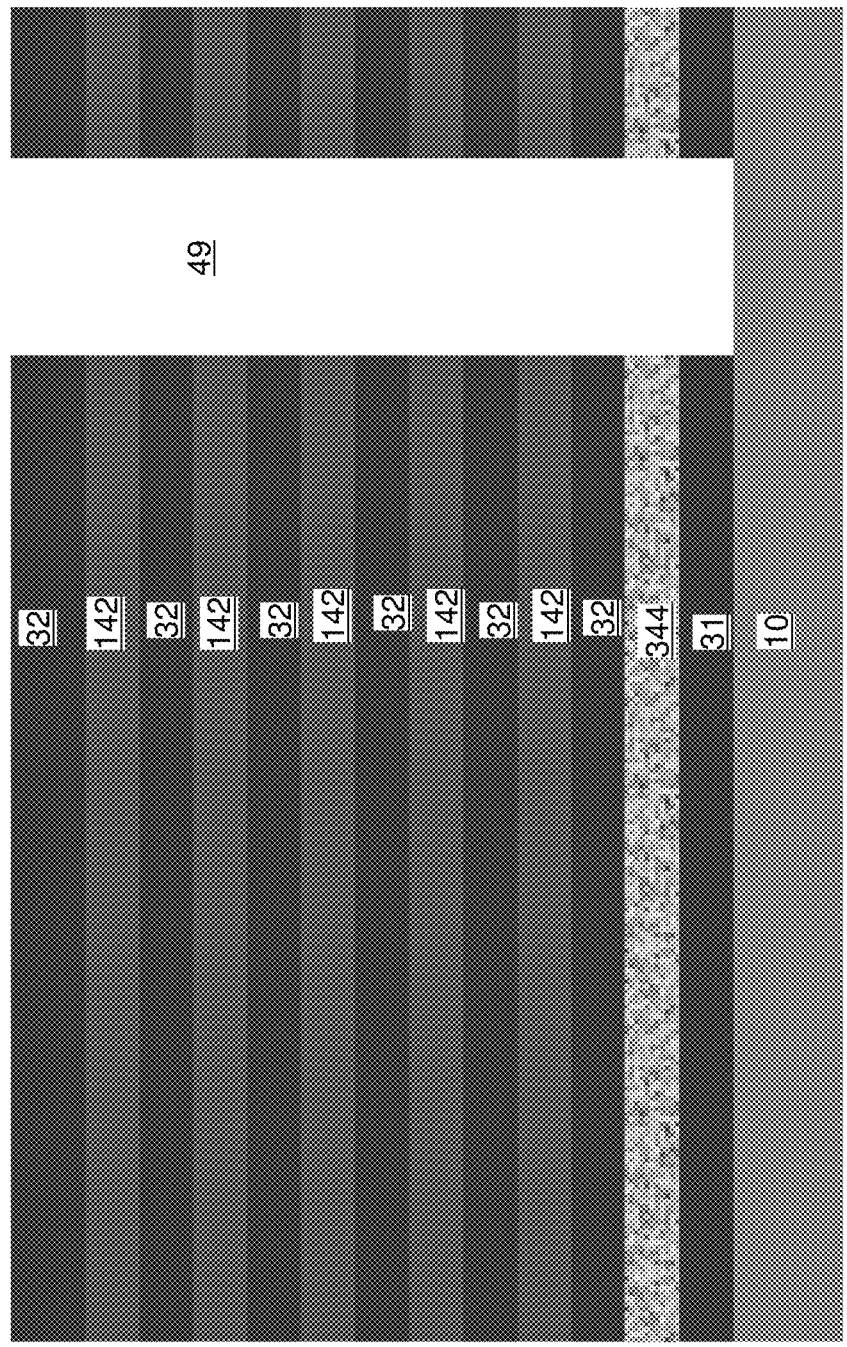
FIG. 24 is a vertical cross-sectional view of the third exemplary structure after formation of a memory opening according to the third embodiment of the present disclosure.

Referring to FIG. 24, at least one memory opening can be formed through the alternating stack (32, 142), the conductive material layer 344, and the bottom insulator layer 31. The etch chemistry for the anisotropic etch can be modified to etch through the conductive material layer 344 in the third embodiment in lieu of the temporary material layer 144 in the first embodiment.

Figure 25:
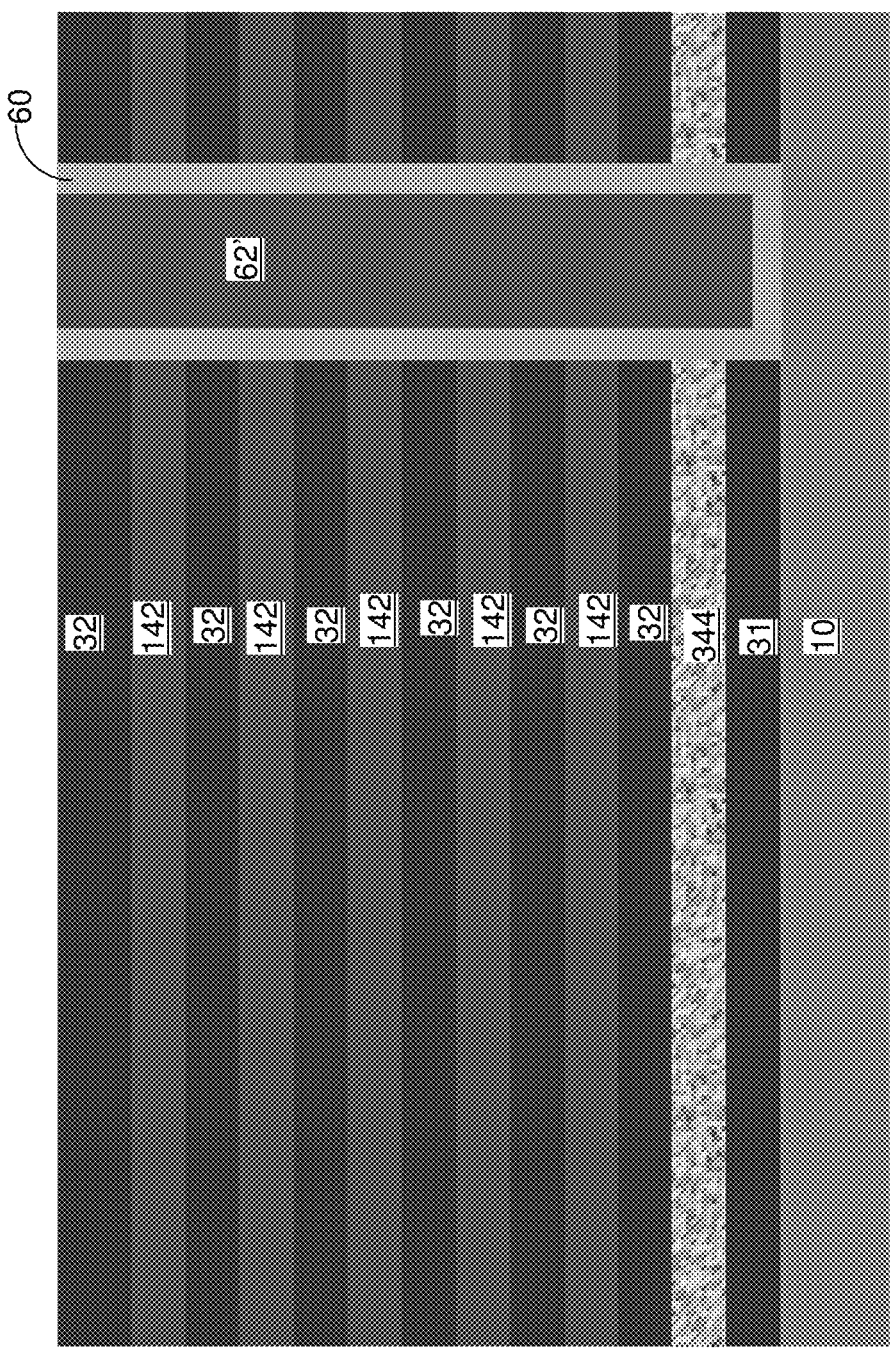
FIG. 25 is a vertical cross-sectional view of the third exemplary structure after formation of a semiconductor channel and a temporary core according to the third embodiment of the present disclosure.

Referring to FIG. 25, a semiconductor channel 60 is formed by deposition of a semiconductor material. The semiconductor channel 60 of the third embodiment can include any of the material that can be employed for the semiconductor channel 60 of the first embodiment, and can be formed employing the same method as in the first embodiment. A temporary core 62' can be formed in the semiconductor channel 60 by deposition of a dielectric material, which can comprise, for example, organosilicate glass (OSG) or silicon oxide. Excess portions of the dielectric material of the temporary core 62' and the semiconductor material of the semiconductor channel 60 can be removed from above the horizontal plane including the top surface of the topmost insulator layer 32, for example, by chemical mechanical planarization.

Figure 26:
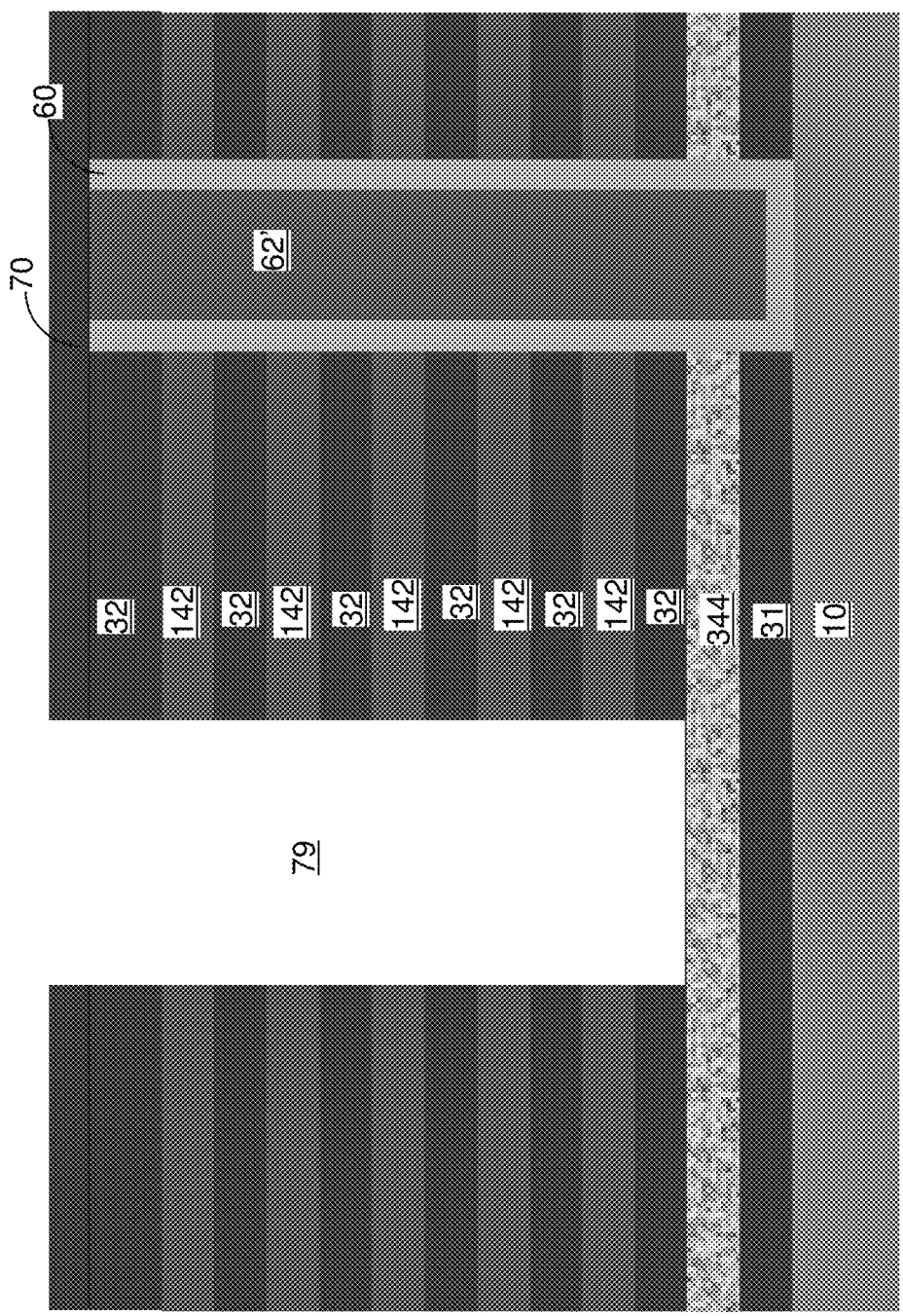
FIG. 26 is a vertical cross-sectional view of the third exemplary structure after formation of a formation of a dielectric capping layer and a backside contact trench according to the third embodiment of the present disclosure.

Referring to FIG. 26, a dielectric cap layer 70 can be deposited over the alternating stack (32, 142) and each combination of a semiconductor channel 60 and a temporary core 62'. The dielectric cap layer 70 includes a dielectric material different from the material of the second material layer 142. In one embodiment, the dielectric cap layer 70 can include silicon oxide. The thickness of the dielectric cap layer 70 can be in a range from 10 nm to 100 nm, although lesser and greater thicknesses can also be employed.

A backside contact trench 79 can be formed through the dielectric cap layer 70 and the alternating stack (32, 142), for example, by application and patterning of a photoresist layer to form an opening, and by an anisotropic etch that transfers the pattern of the opening through the dielectric cap layer 70 and the alternating stack (31, 142). In one embodiment, the conductive material layer 344 can be employed as an etch stop layer. The photoresist layer can be subsequently removed, for example, by ashing.

Figure 27:
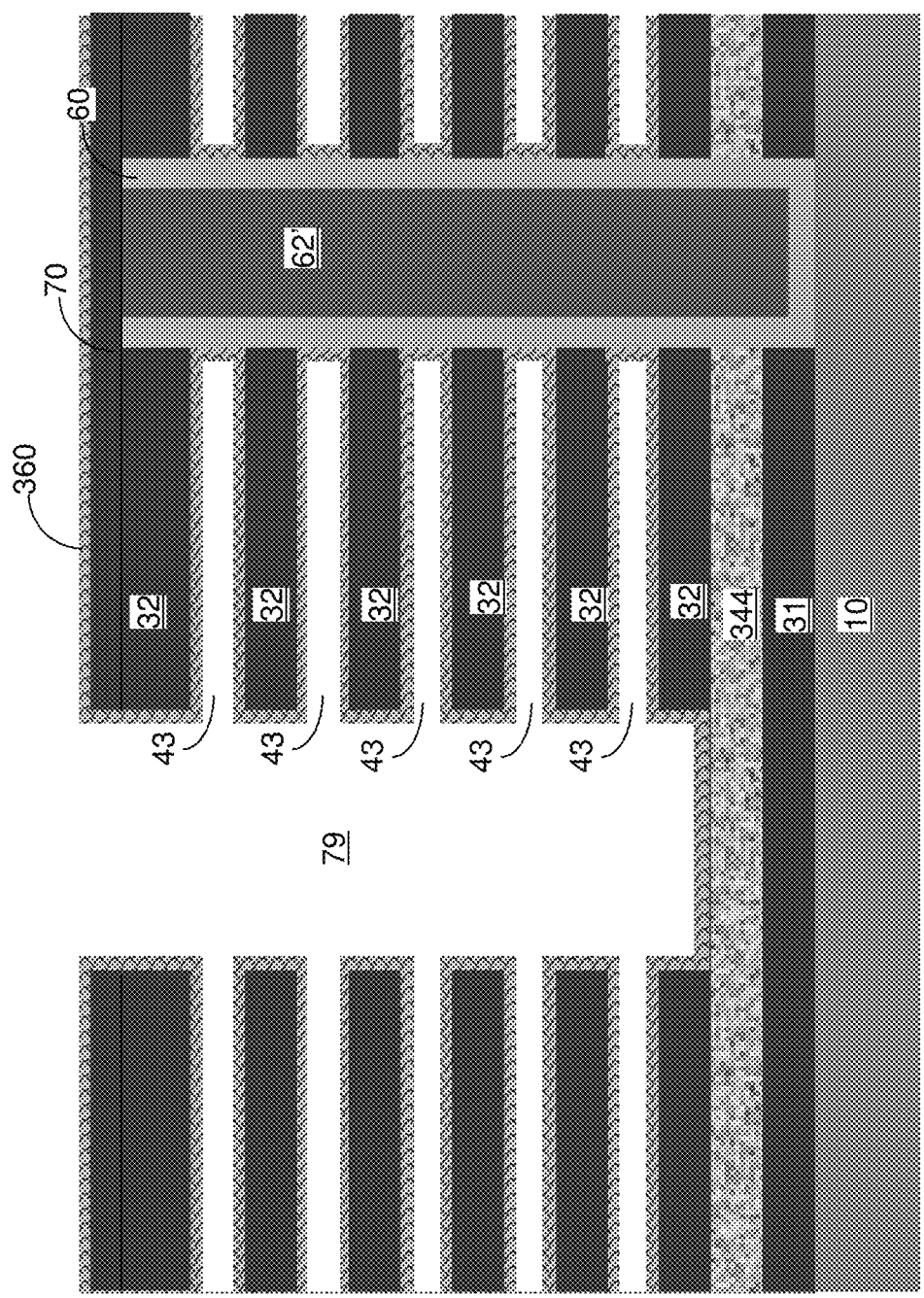
FIG. 27 is a vertical cross-sectional view of the third exemplary structure after formation of a metallic material layer according to the third embodiment of the present disclosure.

Referring to FIG. 27, the second material layers 142 can be removed selective to the first material layers 32, the dielectric cap layer 70, and the conductive material layer 344 employing an isotropic etch process such as a wet etch process. As such, the second material layers 142 are sacrificial material layers. In one embodiment, removal of the second material layers 142 can be selective to the semiconductor material of the semiconductor channel 60. For example, if the second material layers 142 comprise silicon nitride, the first material layers 32 and the dielectric cap layer 70 comprise silicon oxide, and the conductive material layer 344 comprises a combination of titanium nitride liner and a tungsten fill layer, the second material layers 142 can be removed by a wet etch employing hot phosphoric acid. Backside recesses 43 are formed in the volumes from which the second material layers 142 are removed. A portion of the outer sidewall of the semiconductor channel 60 comprising the amorphous or polycrystalline semiconductor material is physically exposed in each backside recess 43.

A metallic material layer 360 comprising a metallic material is formed in the backside recesses 43 and on portions of the outer sidewall of the semiconductor channel 60 that are exposed to the backside recesses 43. The metallic material layer 360 comprises a transition metal element, a combination of two or more transition metal elements, an oxide thereof, and/or a nitride thereof. The metallic material layer 360 includes a transition metal element that can induce crystallization of the semiconductor material within the semiconductor channel 60 in a subsequent anneal process. For example, in case the semiconductor material of the semiconductor channel 60 comprises polysilicon, amorphous silicon, a polycrystalline silicon-germanium alloy, or an amorphous silicon-germanium alloy, the metallic material layer 360 can comprise a material such as nickel, cobalt, other suitable metals and alloys thereof, such as nickel oxide, nickel silicide and/or cobalt silicide. The metallic material layer 360 can be formed, for example, by a conformal deposition method such as chemical vapor deposition (CVD). The thickness of the metallic material layer 360 can be in a range from 1 nm to 30 nm, although lesser and greater thicknesses can also be employed. The metallic material layer 360 is formed directly on a surface of the semiconductor channel 60, i.e., on portions of the outer sidewall of the semiconductor channel 60 at each level of the backside recesses 43.

Figure 28:
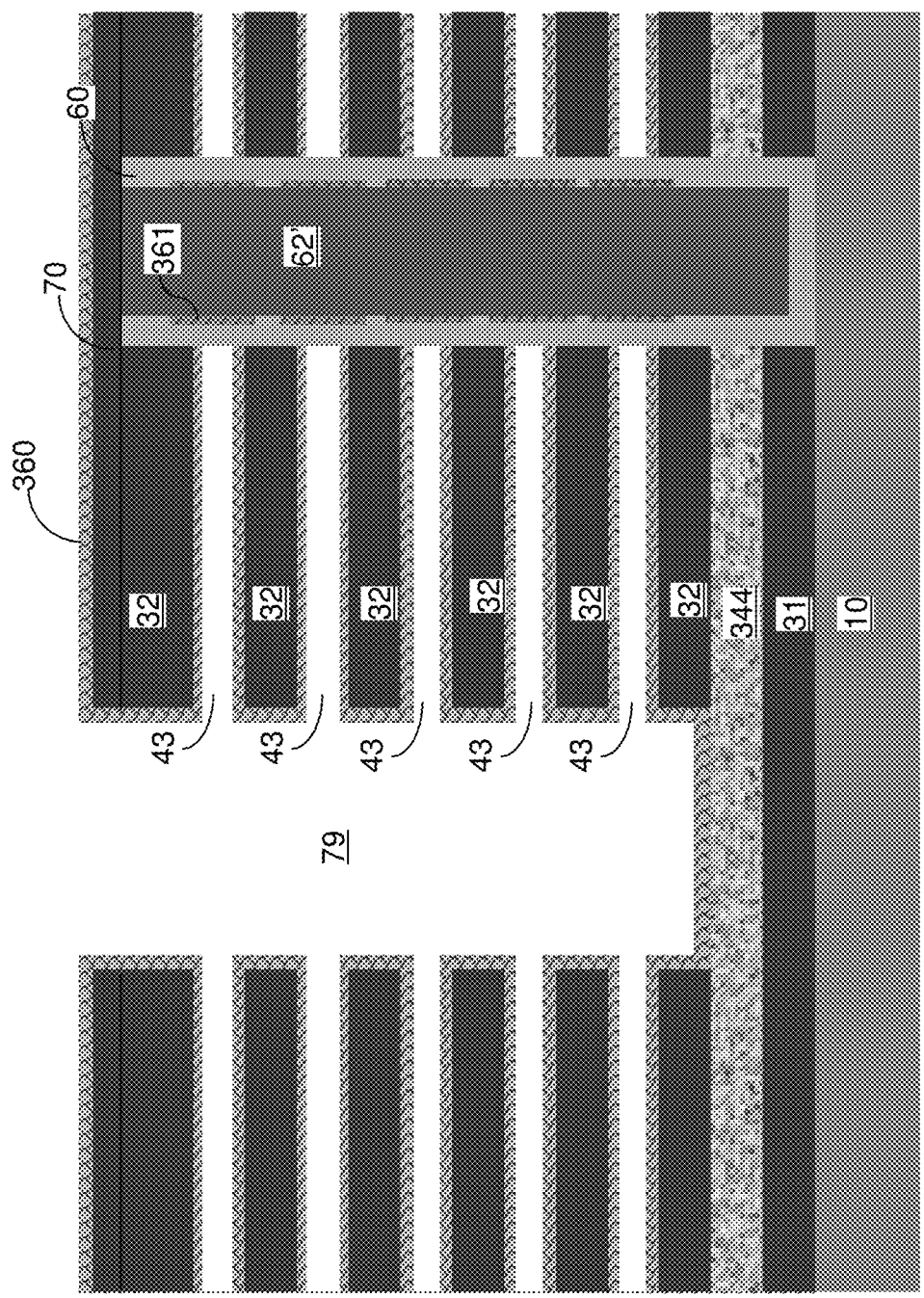
FIG. 28 is a vertical cross-sectional view of the third exemplary structure after diffusing a metallic material through the semiconductor channel according to the third embodiment of the present disclosure.

Referring to FIG. 28, an anneal at an elevated temperature is performed to diffuse the metallic material of the metallic material layer 160 laterally. The elevated temperature of the anneal process can be in a range from 400 degrees Celsius to 1,000 degrees Celsius, although lesser and greater temperatures can also be employed. The duration of the anneal can be in a range from 10 seconds to 240 minutes, although lesser and greater durations can be employed. The metallic material diffuses laterally through at least a portion of the semiconductor channel 60. The metallic material diffuses through the semiconductor channel 60 during the anneal process to crystallize the amorphous or polycrystalline semiconductor material of the semiconductor channel. Specifically, the metallic material diffuses laterally and inward to the inner surface, i.e., the inner sidewall, of the semiconductor channel 60 during the anneal. The metallic material induces crystallization of the amorphous or polycrystalline semiconductor material in the semiconductor channel 60 into a crystalline semiconductor material portion. In other words, the semiconductor channel 60 is converted into a crystalline semiconductor material portion as the metallic material travels through the semiconductor channel 60.

The crystalline semiconductor material portion has a greater grain size than the amorphous or polycrystalline material of the semiconductor channel 60 prior to crystallization. The average grain size of the crystalline semiconductor material portion formed by the anneal process can be greater than the lateral thickness of the semiconductor channel 60, and can be greater than 3 times the lateral thickness of the semiconductor channel 60. The crystalline semiconductor material portion can be polycrystalline.

Metal semiconductor alloy region 361 is formed at an inner sidewall of the semiconductor channel 60 after the anneal process. The metal semiconductor alloy regions 361 include an alloy of the metallic material from the metallic material layer 360 and the semiconductor material of the semiconductor channel 60. In one embodiment, each metal semiconductor alloy region 361 can have an annular shape with an opening therein. In another embodiment, the various metal semiconductor alloy regions 361 can merge to form a single contiguous metal semiconductor alloy layer.

Figure 29:
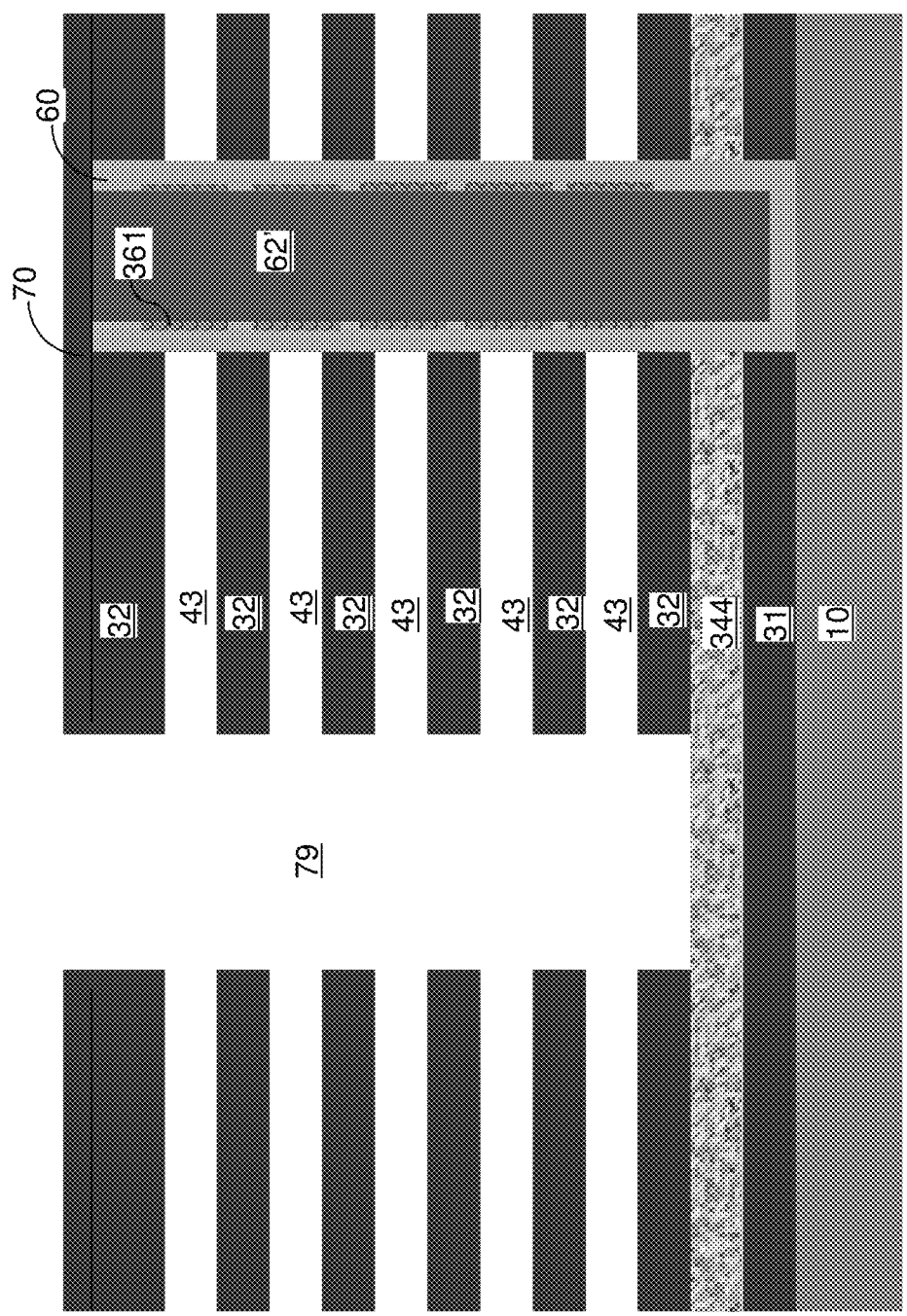
FIG. 29 is a vertical cross-sectional view of the third exemplary structure after removal of the metallic material layer according to the third embodiment of the present disclosure.

Referring to FIG. 29, remaining portions of the metallic material layer 360 can be subsequently removed from the backside recesses 43, from inside the backside contact trench 79, and from above the dielectric cap layer 70, for example, by an etch process such as a wet etch. Removal of the remaining portions of the metallic material layer 360 can be selective to the materials of the semiconductor channel 60 and the insulator layers (the first material layers 32).

Figure 30:
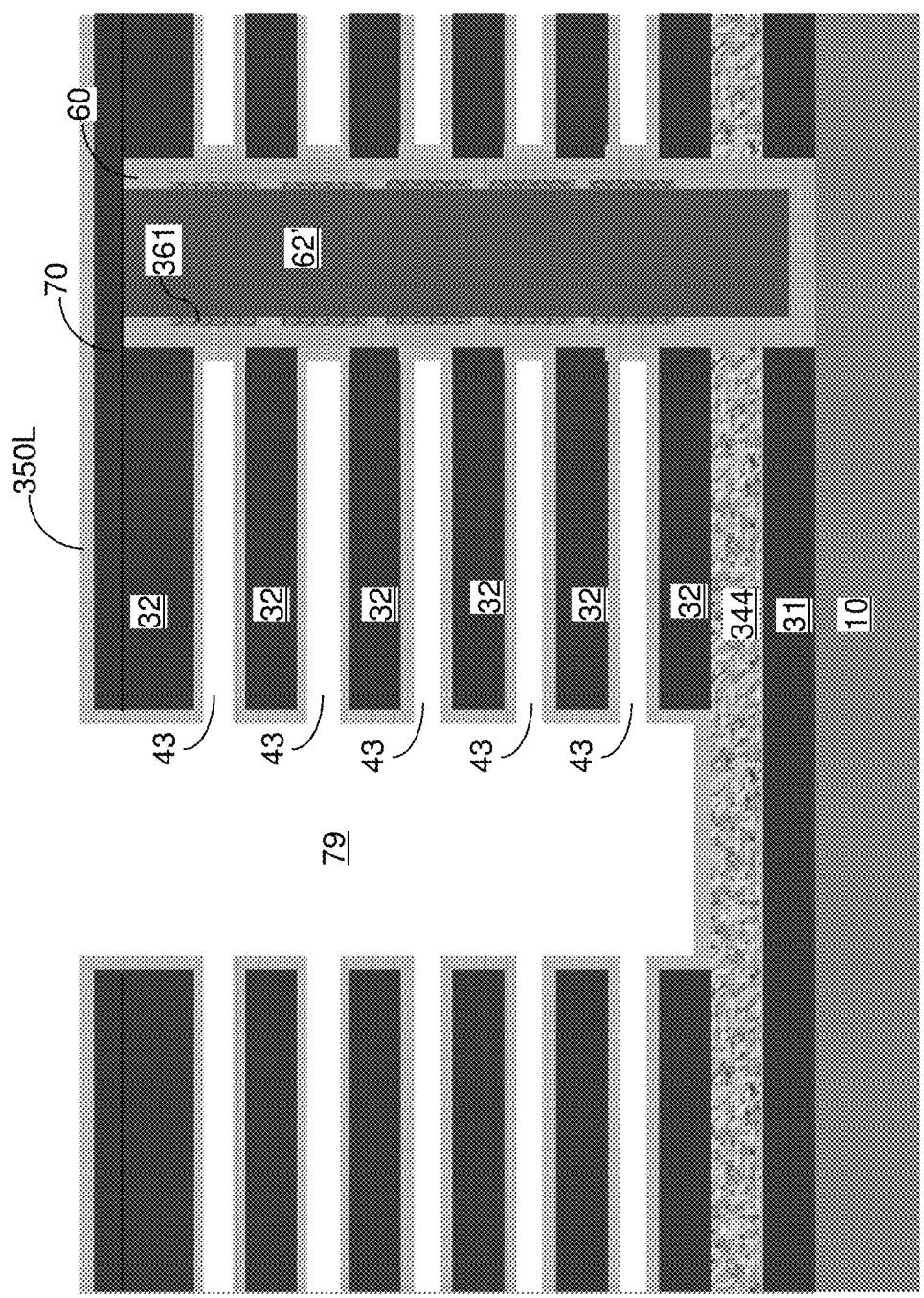
FIG. 30 is a vertical cross-sectional view of the third exemplary structure after formation of a tunneling dielectric layer according to the third embodiment of the present disclosure.

Referring to FIG. 30, a tunneling dielectric 350L can be formed as a contiguous material layer. The tunneling dielectric 350L can comprise the same material as the tunneling dielectric of the first and second embodiments. The tunneling dielectric 350L can be formed on each physically exposed surface of the semiconductor channel 60 within the backside recesses 43. The tunneling dielectric 350L can be formed by a conformal deposition process such as chemical vapor deposition (CVD).

Figure 31:
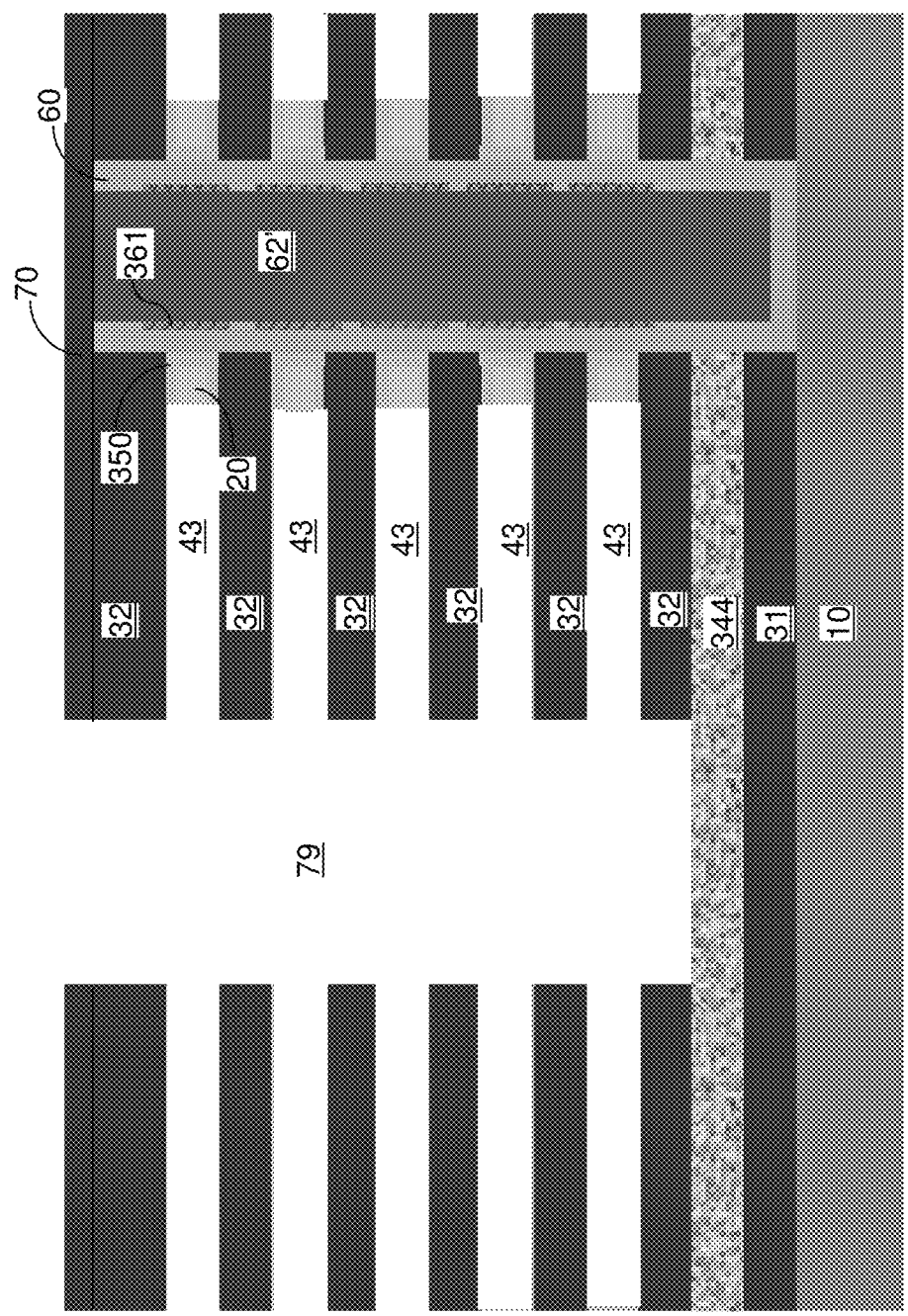
FIG. 31 is a vertical cross-sectional view of the third exemplary structure after formation of vertically spaced combinations of a tunneling dielectric and a floating gate electrode according to the third embodiment of the present disclosure.

Referring to FIG. 31, a plurality of floating gate electrodes 20 can be formed, for example, by conformal deposition of a conductive material, removal of the conductive material from inside the backside contact trench 79 and from above the top surface of the dielectric cap layer 70, and lateral recessing of the deposited conductive material from around the backside contact trench 79 at each level of the second material layers 142, i.e., at each level between a vertically neighboring pair of first material layers 32. The conductive material of the floating gate electrodes 20 can comprise a doped semiconductor material or a metallic material. In one embodiment, each floating gate electrode 20 can laterally surround the semiconductor channel 60 at a level of a backside recess 43.

Optionally, an isotropic etch can be employed to remove physically exposed portions of the tunneling dielectric 350L. In this case, remaining portions of the tunneling dielectric 350L constitutes a plurality of tunneling dielectrics 350 that are disjoined and vertically spaced apart. The vertical extent of each tunneling dielectric 350 can be limited to a level of a backside recess 43, which corresponds to a level of a second material layer 142. Likewise, the vertical extent of each floating gate electrode 20 can be limited to a level of a backside recess 43. In one embodiment, each floating gate electrode 20 can contact a sidewall, a horizontal bottom surface, and a horizontal top surface of a tunneling dielectric 350. A backside recess 43 is present at each level between a neighboring pair of first material layers 32.

Figure 32:
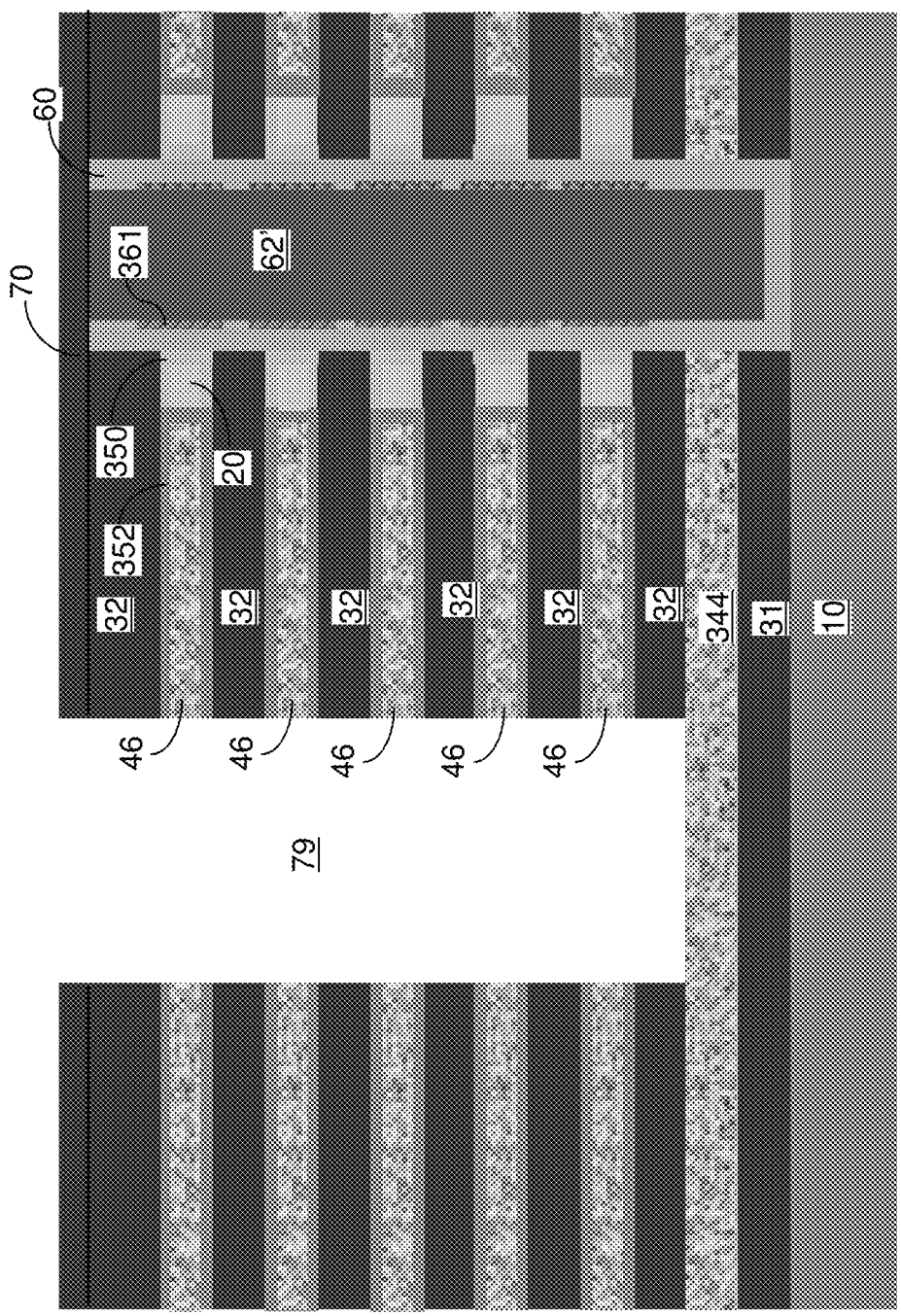
FIG. 32 is a vertical cross-sectional view of the third exemplary structure after formation of a blocking dielectric layer and electrically conductive layers according to the third embodiment of the present disclosure.

Referring to FIG. 32, at least one blocking dielectric 352 can be formed on the plurality of floating gate electrodes 20. The at least one blocking dielectric 352 can have the same composition and thickness as the at least one blocking dielectric of the first embodiment. The at least one blocking dielectric 352 can be formed by conformal deposition of at least one dielectric material layer such as a dielectric metal oxide layer, a dielectric oxide of a semiconductor material (e.g., silicon oxide), or a dielectric nitride of a semiconductor material (e.g., silicon nitride). The tunneling dielectric 350, the plurality of floating gate electrodes 20, and the at least one blocking dielectric 352 collectively constitute a memory film (350, 20, 352), in which data is stored in the form of trapped changes within a respective floating gate electrode 20.

Subsequently, the processing steps of FIG. 7 can be performed to form electrically conductive layers 46. The electrically conductive layer 46 can have the same composition as the electrically conductive layers 46 of the first and second embodiments. Portions of the conductive material deposited within the backside contact trench 79 or above the dielectric cap layer 70 can be removed, for example, by an isotropic etch. Further, portions of the at least one blocking dielectric 352 deposited within the backside contact trench 79 or above the dielectric cap layer 70 can be removed, for example, by another isotropic etch. The conductive material layers 46 can comprise a plurality of control gate electrodes of a vertical NAND device. Optionally, a subset of the electrically conductive layers 46 can comprise source select gate electrodes or drain select gate electrodes. In one embodiment, a plurality of control gate electrodes can be formed around the memory film (350, 20, 352) at each level that corresponds to a respective second material layer 142.

Figure 33:
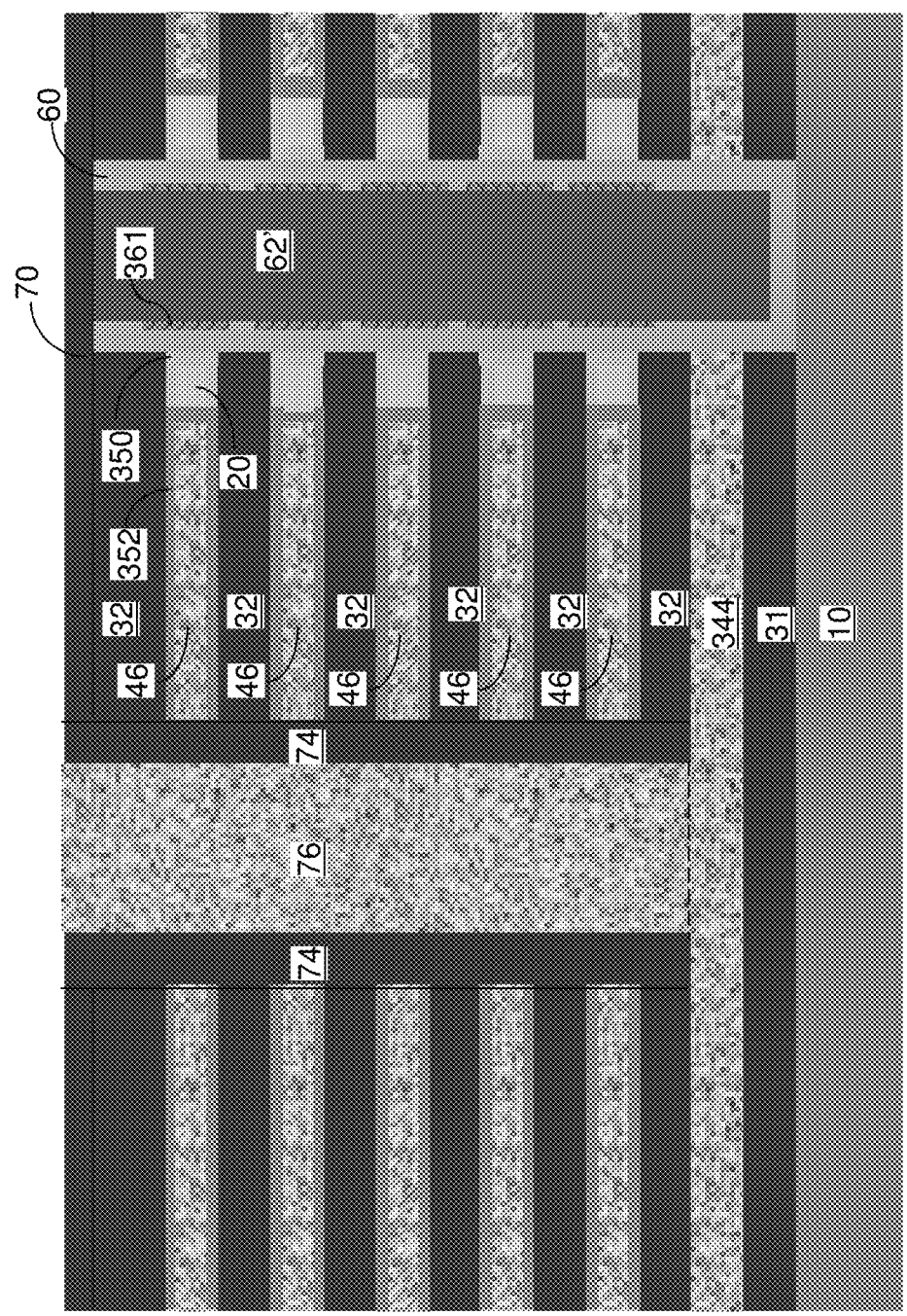
FIG. 33 is a vertical cross-sectional view of the third exemplary structure after formation of an integrated via and layer structure according to the third embodiment of the present disclosure.

Referring to FIG. 33, the processing steps of FIG. 7 and the processing steps of FIG. 12 are performed to form an insulating spacer 74 and a backside contact via structure 76. The backside contact via structure 76 is electrically shorted to a bottom portion of the semiconductor channel 60 via the conductive material layer 344. In one embodiment, the backside contact via structure 76 comprises the same material as the conductive material layer 344. In another embodiment, the backside contact via structure 76 comprises a different material from the conductive material layer 344. Alternatively, layer 344 is omitted and the alternative structure of FIG. 22 containing the backside contact via structure 179 and the horizontal semiconductor channel portion in the substrate 10 may be used in the device of the third embodiment instead. In one embodiment, a recess etch or an over-polishing can be employed to remove the dielectric cap layer 70, and to physically expose the top surface of the temporary core 62'.

Figure 34:
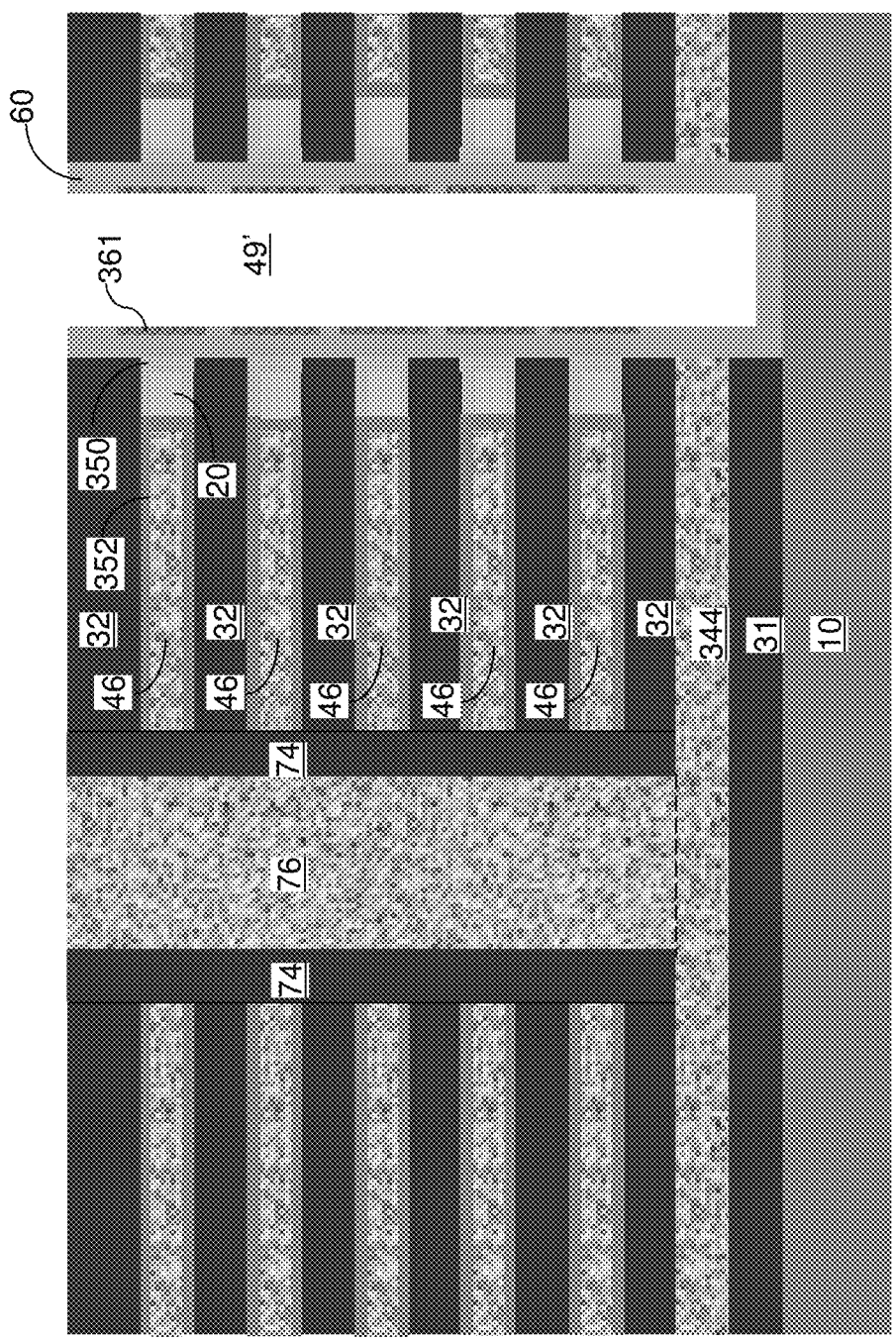
FIG. 34 is a vertical cross-sectional view of the third exemplary structure after removal of the temporary core according to the third embodiment of the present disclosure.

Referring to FIG. 34, the temporary core 62' is removed selective to the semiconductor channel 60. If the semiconductor channel 60 comprises a crystalline silicon or a crystalline silicon-germanium alloy, and the temporary core 62' comprises organosilicate glass (OSG) or silicon oxide, a wet etch can be employed to remove the temporary core 62' selective to the semiconductor channel 60.

Figure 35:
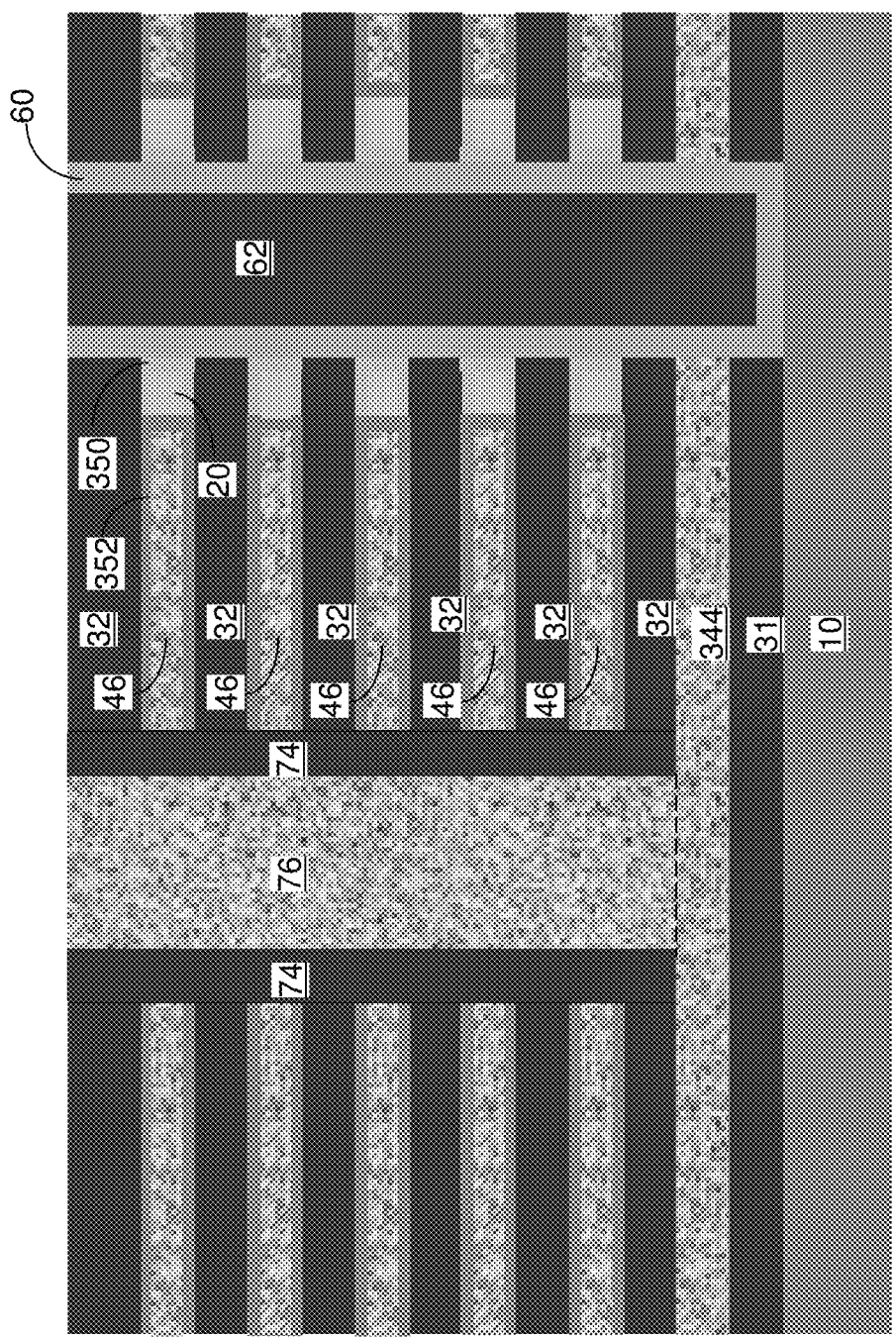
FIG. 35 is a vertical cross-sectional view of the third exemplary structure after formation of a dielectric core according to the third embodiment of the present disclosure.

Referring to FIG. 35, the metal semiconductor alloy regions 361 can be removed selective to the semiconductor channel 60 employing an isotropic etch process, which can be, for example, a wet etch process. The surfaces of the semiconductor channel 60 can be substantially free of the metallic material of the metal semiconductor alloy regions 361 after the isotropic etch process.

Subsequently, a dielectric core 62 can be formed by deposition of a dielectric material into the cavity within the semiconductor channel 60, and by removal of excess portions of the deposited dielectric material from above the horizontal plane including the top surface of the topmost insulator layer, i.e., the topmost first material layer 32.

The third exemplary structure can be a three-dimensional memory device that comprises a vertical NAND device formed in a device region. The electrically conductive layers 46 can be formed at levels corresponding to the second material layers 142, and the electrically conductive layers 46 can comprise, or can be electrically connected to, a respective word line of the NAND device.

In one embodiment, the device region can comprise a plurality of memory stack structures (352, 20, 350, 60, 62). In this case, the device region can comprise a plurality of semiconductor channels 60. At least one end portion of each of the plurality of semiconductor channels 60 extends substantially perpendicular to the top surface of the substrate 10. The device region can comprise a plurality of charge storage regions (i.e., the plurality of floating gate electrodes 20) such that each charge storage region located adjacent to a respective one of the plurality of semiconductor channels 60 and within a respective portion of the memory film (352, 20, 350). The device region can comprise a plurality of control gate electrodes having a strip shape extending substantially parallel to the top surface of the substrate 10. The plurality of control gate electrodes can comprise at least a first control gate electrode located in a first device level and a second control gate electrode located in a second device level. The electrically conductive layers 46 in the stack (32, 46) can be in electrical contact with the plurality of control gate electrode and extend from the device region to a contact region including a plurality of electrically conductive via connections, which are contact via structures providing electrical connection. The substrate 10 can comprise a silicon substrate containing a driver circuit for the NAND device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a monolithic three-dimensional memory device, comprising:
    forming a stack including an alternating plurality of first material layers and second material layers over a substrate;
    forming an opening that vertically extends through the stack;
    forming a semiconductor channel comprising an amorphous or polycrystalline semiconductor material over a sidewall of the opening, wherein the semiconductor channel extends through the stack;
    diffusing a metallic material through at least a portion of the semiconductor channel, wherein the metallic material induces crystallization of the amorphous or polycrystalline semiconductor material in the semiconductor channel into a crystalline semiconductor material portion; and
    forming backside recesses by removing the second material layers selective to the first material layers, wherein a portion of the outer sidewall of the semiconductor channel comprising the amorphous or polycrystalline semiconductor material is physically exposed in each backside recess.

2. The method of claim 1, further comprising:
    forming a metallic material layer comprising the metallic material on a surface of the semiconductor channel; and
    annealing the semiconductor channel comprising the amorphous or polycrystalline semiconductor material and the metallic material layer in an anneal process, wherein the metallic material diffuses through the semiconductor channel during the anneal process to crystallize the amorphous or polycrystalline semiconductor material.

3. The method of claim 2, wherein the metallic material diffuses downward from a top portion of the semiconductor channel to a bottommost portion of the semiconductor channel.

4. The method of claim 3, wherein a metal semiconductor alloy region is formed at a bottom region of the semiconductor channel, the metal semiconductor alloy region comprises an alloy of the metallic material and the amorphous or polycrystalline semiconductor material.

5. The method of claim 2, further comprising forming a memory film on the sidewall of the opening, wherein the semiconductor channel is formed on the memory film.

6. The method of claim 5, wherein the semiconductor channel is electrically isolated from the substrate by a horizontal portion of the memory film after formation of the crystalline semiconductor material portion.

7. The method of claim 1, further comprising:
    forming a memory film on the sidewall of the opening, wherein the semiconductor channel is formed on the memory film; and
    forming an integrated via and layer structure that contacts a region of the crystalline semiconductor material portion and extending through the stack along a direction parallel to a top surface of the substrate.

8. The method of claim 7, further comprising forming a plurality of control gate electrodes around the memory film at each level that corresponds to the second material layers.

9. The method of claim 8, wherein the region of the crystalline semiconductor material portion is located underneath the plurality of control gate electrodes.

10. The method of claim 7, further comprising:
    forming a contact via trench through the stack;
    forming a lateral cavity that extends between the contact via trench and a portion of the memory film; and
    physically exposing a surface of the semiconductor channel by removing the portion of the memory film, wherein the integrated via and layer structure is formed by depositing at least one conductive material on the physically exposed surface of a region of the crystalline semiconductor material portion.

11. The method of claim 10, wherein the region of the crystalline semiconductor material portion is a source region that is formed by introducing electrical dopants through the surface of the semiconductor channel.

12. The method of claim 1, further comprising:
    forming a metallic material portion comprising the metallic material over the substrate, wherein the semiconductor channel is formed on the metallic material portion; and
    annealing the semiconductor channel comprising the amorphous or polycrystalline semiconductor material and the metallic material layer in an anneal process, wherein the metallic material diffuses through the semiconductor channel during the anneal process to induce crystallization of the amorphous or polycrystalline semiconductor material in the semiconductor channel.

13. The method of claim 12, wherein the metallic material diffuses upward to an inner sidewall of the semiconductor channel.

14. The method of claim 12, wherein:
    the anneal process induces formation of a metal semiconductor alloy region over a top portion of the semiconductor channel; and
    the metal semiconductor alloy region comprises an alloy of the metallic material and the amorphous or polycrystalline semiconductor material.

15. The method of claim 14, further comprising removing the metal semiconductor alloy region.

16. The method of claim 12, further comprising forming a memory film on the sidewall of the opening, wherein the semiconductor channel is formed on the memory film.

17. The method of claim 16, wherein the semiconductor channel is formed by:
    forming a first semiconductor channel layer on an inner sidewall of the memory film;
    extending the opening through bottom portions of the first semiconductor channel layer and the memory film and to a top surface of the metallic material portion; and
    forming a second semiconductor channel layer on the first semiconductor channel layer and the metallic material portion, wherein the first and second semiconductor channel layers collectively constitute the semiconductor channel.

18. The method of claim 16, wherein:
the substrate comprises a semiconductor material portion;
the metallic material portion is formed on the semiconductor material portion; and
the crystalline semiconductor material portion of the semiconductor channel contacts the semiconductor material portion after the anneal process.

19. The method of claim 1, further comprising:
forming a metallic material layer comprising the metallic material in the backside recesses and on portions of an outer sidewall of the semiconductor channel; and
annealing the semiconductor channel comprising the amorphous or polycrystalline semiconductor material and the metallic material layer in an anneal process, wherein the metallic material diffuses through the semiconductor channel during the anneal process to induce crystallization of the amorphous or polycrystalline semiconductor material in the semiconductor channel.

20. The method of claim 19, wherein the metallic material diffuses laterally and inward to an inner surface of the semiconductor channel.

21. The method of claim 20, wherein at least one metal semiconductor alloy region is formed at an inner sidewall of the semiconductor channel, the metal semiconductor alloy region comprises an alloy of the metallic material and the amorphous or polycrystalline semiconductor material.

22. The method of claim 21, further comprising removing the at least one metal semiconductor alloy region from the inner sidewall of the semiconductor channel.

23. The method of claim 19, further comprising:
removing remaining portions of the metallic material layer from the backside recesses after the anneal process; and
forming a memory film on each portion of an outer sidewall of the semiconductor channel through the backside recesses.

24. The method of claim 23, wherein forming the memory film comprises:
forming a tunneling dielectric on each physically exposed surface of the semiconductor channel within the backside recesses;
forming a plurality of floating gate electrodes on the tunneling dielectric; and
forming a blocking dielectric on the plurality of floating gate electrodes.

25. The method of claim 19, wherein the semiconductor channel is formed directly on a sidewall of the opening prior to formation of the backside recesses.

26. The method of claim 19, further comprising forming a plurality of control gate electrodes around the opening within portions of the backside recesses at each level that corresponds to the second material layers.

27. The method of claim 1, wherein:
the semiconductor channel comprises a material selected from amorphous silicon, polycrystalline silicon, an amorphous silicon-germanium alloy, and an polycrystalline silicon-germanium alloy; and
the metallic material comprises a material selected from a transition metal element, a combination of two or more transition metal elements, an oxide thereof, and a nitride thereof.

28. The method of claim 1, wherein:
the three-dimensional memory device comprises a vertical NAND device formed in a device region; and
forming electrically conductive layers at levels corresponding to the second material layers, wherein the electrically conductive layers comprise, or are electrically connected to, a respective word line of the NAND device.

29. The method of claim 28, wherein:
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrode and extend from the device region to a contact region including a plurality of electrically conductive via connections; and
the substrate comprises a silicon substrate containing a driver circuit for the NAND device.

* * * * *